(12) United States Patent
Tombak et al.

(10) Patent No.: US 10,594,357 B2
(45) Date of Patent: Mar. 17, 2020

(54) RADIO FREQUENCY SWITCH SYSTEM

(71) Applicant: Qorvo US, Inc., Greensboro, NC (US)

(72) Inventors: Ali Tombak, Cary, NC (US); Daniel Charles Kerr, Oak Ridge, NC (US); Edward T. Spears, Stokesdale, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/161,436

(22) Filed: Oct. 16, 2018

(65) Prior Publication Data

US 2019/0140686 A1    May 9, 2019

Related U.S. Application Data

(60) Provisional application No. 62/582,704, filed on Nov. 7, 2017.

(51) Int. Cl.

| | |
|---|---|
| *H04B 1/48* | (2006.01) |
| *H03K 17/693* | (2006.01) |
| *H01Q 1/50* | (2006.01) |
| *H01Q 3/24* | (2006.01) |
| *H02H 9/04* | (2006.01) |

(Continued)

(52) U.S. Cl.
CPC ............. *H04B 1/48* (2013.01); *H01Q 1/50* (2013.01); *H01Q 3/24* (2013.01); *H02H 9/046* (2013.01); *H03K 17/693* (2013.01); *H01P 1/15* (2013.01); *H01Q 21/065* (2013.01); *H04B 2001/485* (2013.01)

(58) Field of Classification Search
CPC ................................ H03K 17/102; H04B 1/48
See application file for complete search history.

(56) References Cited

U.S. PATENT DOCUMENTS

| | | | | |
|---|---|---|---|---|
| 5,578,976 A | * | 11/1996 | Yao | ........... H01H 59/0009 |
| | | | | 200/181 |
| 2007/0030101 A1 | * | 2/2007 | Mizutani | ........... H01P 1/15 |
| | | | | 333/262 |

(Continued)

OTHER PUBLICATIONS

Aftab, N., et al., "Reconfigurable Patch Antenna for Wireless Applications," 9th European Conference on Antennas and Propagation, Lisbon, 2015, pp. 1-3.

(Continued)

*Primary Examiner* — Hsinchun Liao
(74) *Attorney, Agent, or Firm* — Withrow & Terranova, P.L.L.C.

(57) ABSTRACT

A radio frequency switch system includes a plurality of radio frequency switch circuitries that each include a switch branch coupled between a first branch terminal and a second branch terminal and are configured to allow passage of a radio frequency signal through the switch branch in an on-state and to block the radio frequency signal from passing through the switch branch in an off-state in response to a control signal applied to a branch control terminal of the switch branch. Also included is a switch controller configured to apply the control signal to the branch control terminal of the switch branch of each of the plurality of radio frequency switch circuitries, wherein the control signal has a first voltage level that places the switch branch in the on-state and a second voltage level that places the switch branch in the off-state without digital signal decoding of the control signal.

23 Claims, 24 Drawing Sheets

(51) Int. Cl.
*H01P 1/15* (2006.01)
*H01Q 21/06* (2006.01)

(56) References Cited

U.S. PATENT DOCUMENTS

| | | | |
|---|---|---|---|
| 2008/0100399 A1 | 5/2008 | Atsumo et al. | |
| 2008/0299897 A1* | 12/2008 | Mohebbi | H01Q 21/065 455/11.1 |
| 2010/0194476 A1 | 8/2010 | Drogi et al. | |
| 2011/0260780 A1* | 10/2011 | Granger-Jones | H03K 17/102 327/537 |
| 2012/0081262 A1 | 4/2012 | Tanaka et al. | |
| 2014/0179241 A1 | 6/2014 | Aggarwal et al. | |
| 2015/0303982 A1 | 10/2015 | Yang et al. | |
| 2016/0173063 A1 | 6/2016 | Han et al. | |
| 2016/0285447 A1 | 9/2016 | Krishnamurthi et al. | |
| 2017/0214418 A1 | 7/2017 | Rozek et al. | |
| 2018/0204101 A1 | 7/2018 | De Jongh et al. | |
| 2018/0254751 A1 | 9/2018 | Benson | |

OTHER PUBLICATIONS

Arcioni, P., et al., "A Novel Low Reflection-Loss MEMS Reconfigurable Patch Antenna," Proceedings of the 10th European Conference on Wireless Technology, Munich, 2007, pp. 257-260.
Asadallah, F. A., et al., A Digitally Tuned Reconfigurable Patch Antenna for IoT Devices, IEEE International Symposium on Antennas and Propagation & USNC/URSI National Radio Science Meeting, San Diego, California, 2017, pp. 917-918.
Bhattacharya, A., et al., "Frequency Reconfigurable Patch Antenna Using PIN Diode at X-Band," IEEE 2nd International Conference on Recent Trends in Information Systems, Kolkata, 2015, pp. 81-86.
Enayati, Amin, et al., "RF-MEMs-based Millimeter-wave Switch for Integrated Antenna Applications," Proceedings of the 5th European Conference on Antennas and Propagation, Apr. 2011, IEEE, pp. 2246-2249.
Haider, N., et al., "L/S-Band Frequency Reconfigurable Multiscale Phased Array Antenna with Wide Angle Scanning," IEEE Transactions on Antennas and Propagation, vol. 65, Issue 9, Sep. 2017, pp. 4519-4528.
Priya, C., et al., "A Novel Cram of Reconfigurable Patch Antenna Using RF MEMS," International Conference on Emerging Trends in VLSI, Embedded System, Nano Electronics and Telecommunication System, Tiruvannamalai, 2013, pp. 1-5.
Non-Final Office Action for U.S. Appl. No. 16/161,454, dated Feb. 26, 2019, 8 pages.
Notice of Allowance for U.S. Appl. No. 16/161,454, dated Apr. 2, 2019, 9 pages.
Non-Final Office Action for U.S. Appl. No. 16/161,444, dated Jul. 1, 2019, 21 pages.
Corrected Notice of Allowance for U.S. Appl. No. 16/161,454, dated Jun. 3, 2019, 6 page.
Final Office Action for U.S. Appl. No. 16/161,444, dated Nov. 21, 2019, 9 pages.

\* cited by examiner

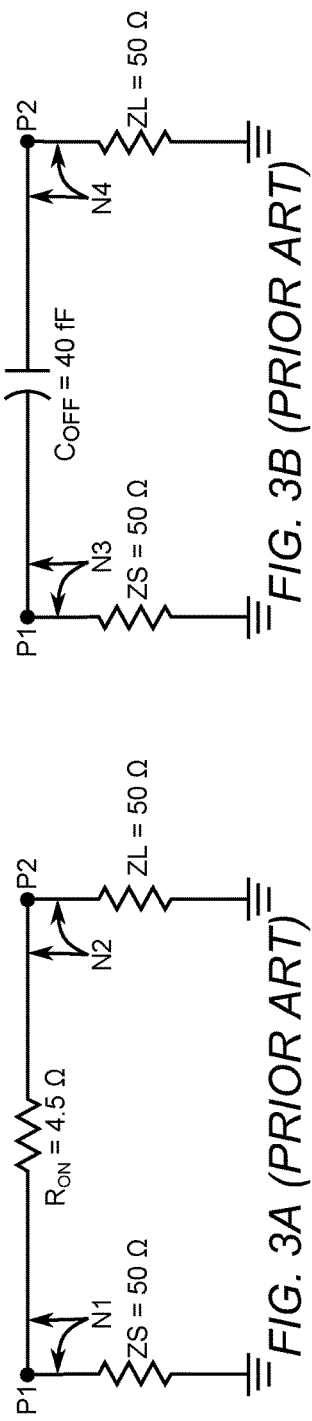
*FIG. 3A (PRIOR ART)*
*FIG. 3B (PRIOR ART)*
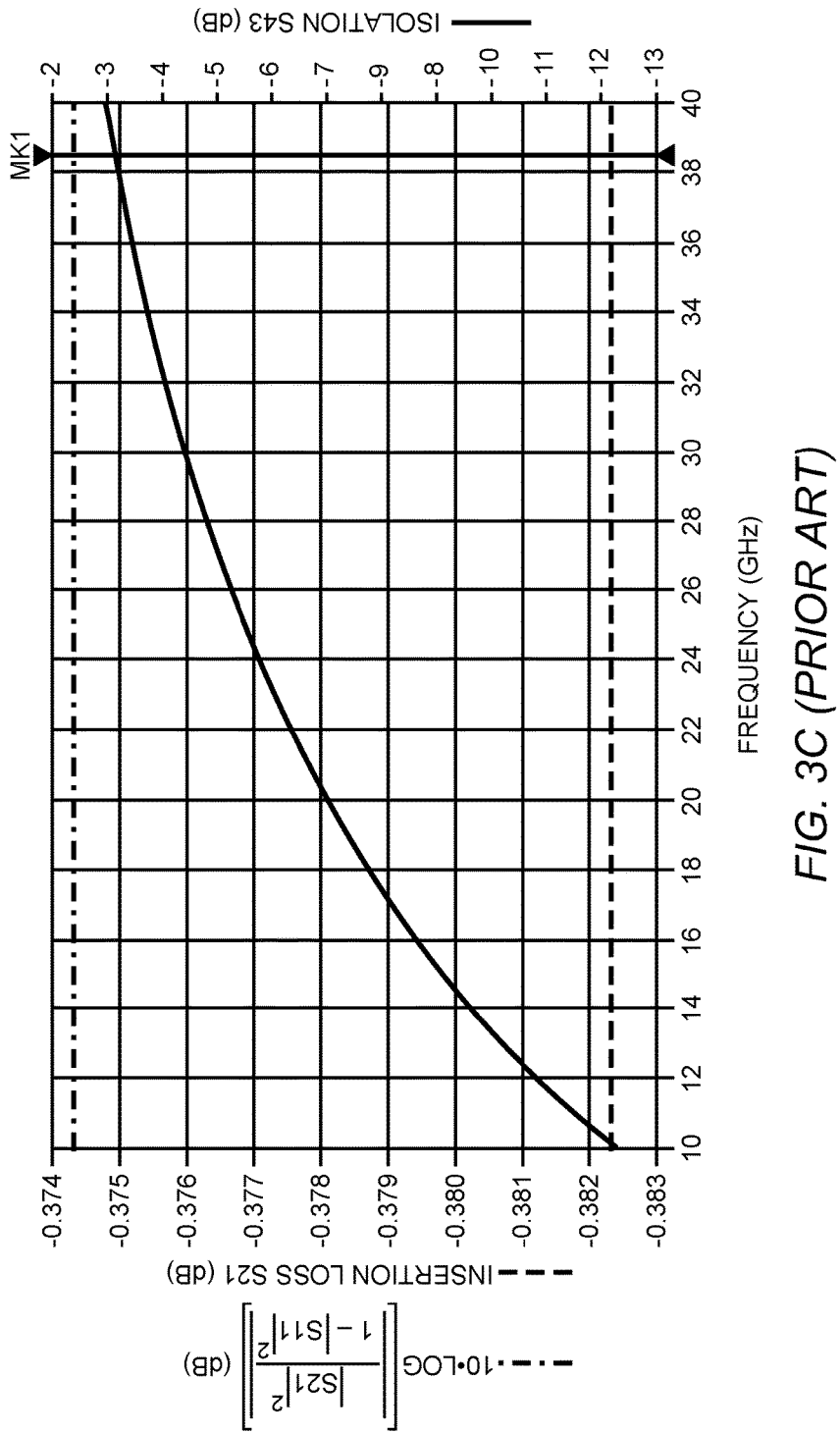
*FIG. 3C (PRIOR ART)*

RADIO FREQUENCY SWITCH SYSTEM

RELATED APPLICATIONS

This application claims the benefit of provisional patent application Ser. No. 62/582,704, filed Nov. 7, 2017, the disclosure of which is hereby incorporated herein by reference in its entirety.

This application is related to U.S. patent application Ser. No. 16/161,444, filed Oct. 16, 2018, published as U.S. Patent Application Publication No. 2019/0140687 on May 9, 2019, and titled RADIO FREQUENCY SWITCH BRANCH CIRCUITRY, which claims benefit of provisional patent application No. 62/582,714, filed Nov. 7, 2017; U.S. patent application Ser. No. 16/161,543, filed Oct. 16, 2018, published as U.S. Patent Application Publication No. 2019/0140353 on May. 9, 2019, and titled RECONFIGURABLE PATCH ANTENNA AND PHASED ARRAY, which claims benefit of provisional patent application Ser. No. 62/583,195, filed Nov. 8, 2017; and U.S. patent application Ser. No. 16/161,454, filed Oct. 16, 2018, and subsequently patented as U.S. Pat. No. 10,389,400 on Aug. 20, 2019, and titled RADIO FREQUENCY SWITCH CIRCUITRY, which claims benefit of provisional patent application Ser. No. 62/582,704, filed Nov. 7, 2017, the disclosures of which are hereby incorporated herein by reference in their entireties.

FIELD OF THE DISCLOSURE

The present disclosure relates to radio frequency switch systems used for wireless communication and in particular to radio frequency systems in which minimal real estate for radio frequency switch circuitry is desirable.

BACKGROUND

Radio frequency switch circuitry is widely used in many applications such as front-end modules and antenna tuning networks. As the capacity of cellular wireless networks increases due to consumer demand, new frequency bands are introduced along with new wireless standards. Fifth-generation (5G) wireless networks have a new standard for wireless operation in millimeter wavelength frequency bands that include 28 GHz, 38 GHz, and 66 GHz radio frequencies. Radio frequency switch circuitry having switch branches coupled between signal ports must provide high isolation between the signal ports through high impedance when the switch branches are in an off-state and low impedance when the switch branches are in an on-state. The new 5G wireless radio frequencies present a new challenge to provide a high off-state to on-state impedance ratio while maintaining maximum isolation in the off-state and minimal insertion loss in the on-state. As such, what is needed is a new radio frequency switch circuitry that provides a high off-state to on-state impedance ratio for switch branches while maintaining maximum isolation with the switch branches in the off-state and minimal insertion loss in the switch branches in the on-state.

SUMMARY

A radio frequency switch system includes a plurality of radio frequency switch circuitries that each include a switch branch coupled between a first branch terminal and a second branch terminal and are configured to allow passage of a radio frequency signal through the switch branch in an on-state and to block the radio frequency signal from passing through the switch branch in an off-state in response to a control signal applied to a branch control terminal of the switch branch. Also included is a switch controller configured to apply the control signal to the branch control terminal of the switch branch of each of the plurality of radio frequency switch circuitries, wherein the control signal has a first voltage level that places the switch branch in the on-state and a second voltage level that places the switch branch in the off-state without digital signal decoding of the control signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 3A is a schematic of an on-state simulation circuit for the prior art switch branch represented as the on-state resistance between the first port terminal and the second port terminal.

FIG. 3B is a schematic of an off-state simulation circuit for the prior art switch branch represented as the off-state capacitance between the first port terminal and the second port terminal.

FIG. 3C is a graph of power gain, insertion loss, and isolation plotted from simulations of the on-state simulation circuit of FIG. 3A and the off-state simulation circuit of FIG. 3B.

DETAILED DESCRIPTION

Figure 1A:
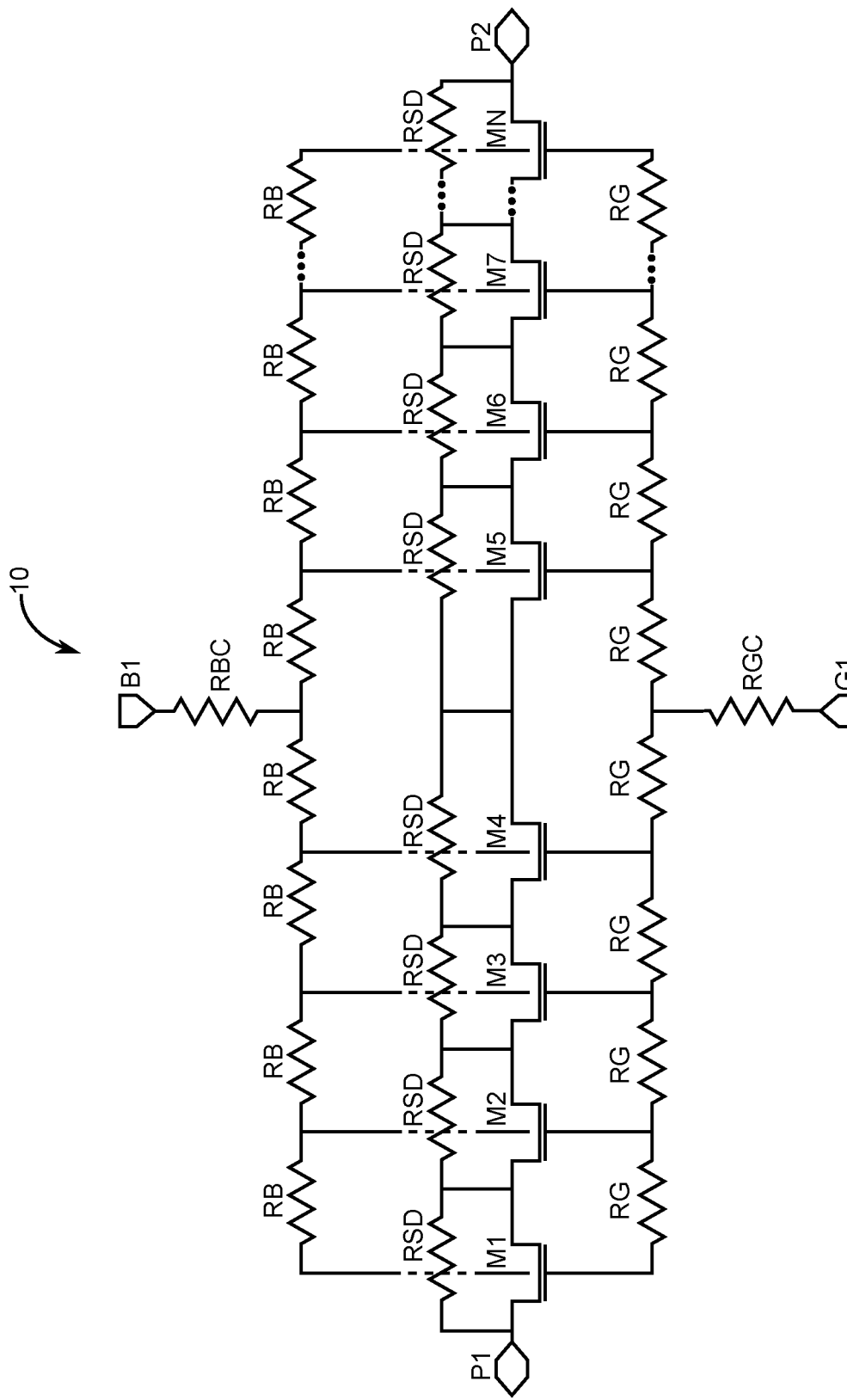
FIG. 1A is a schematic of a prior art switch branch 10 including resistor networks.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For example, in this disclosure, digital signal decoding is defined as resolving digital signals into addresses and commands using digital processing through digital logic gates. Examples of digital signals that require digital signal decoding are preambles, addresses, and commands delivered over a general purpose input/output (GPIO) bus.

FIG. 1A is a schematic of a prior art switch branch 10 including resistor networks. In particular, the prior art switch branch 10 is made up of a series-coupled stack of field-effect transistors M1 through MN. A source-to-drain resistor network is made up of source-to-drain resistors RSD, each of which is coupled from source-to-drain across each of the field-effect transistors M1 through MN. A gate resistor network is made up of gate resistors RG that are coupled between gates of adjacent ones of the field-effect transistors M1 through MN. A body resistor network is made up of body resistors RB coupled to body terminals of the field-effect transistors M1 through MN.

A gate terminal G1 is coupled to the gate resistor network through a common gate resistor RGC, and a body terminal B1 is coupled to the body resistor network through a common body resistor RBC, each of which receives a bias voltage to control an on-state for passing a radio frequency signal between a first port terminal P1 and a second port terminal P2 and an off-state that prevents passage of the radio frequency signal between the first port terminal P1 and the second port terminal P2. Table 1, below, lists some typical bias values (in volts) for a gate bias voltage VG and a body bias voltage VB that are applied to the gate terminal G1 and body terminal B1, respectively. In the on-state, the source, drain, and body bias voltages are set to 0 volts and the gate is biased to 2.5 volts. In the off-state, the source and drain are biased to 0 volts, but the body and gate are both set to −2.5 volts, e.g., strongly off. The body is sometimes referred to as "the bulk."

TABLE 1

| Switch Mode | VG (Gate Voltage) | VB (Body Voltage) | VS/VD (Source/Drain Voltage) |
| --- | --- | --- | --- |
| On-state | 2.5 V | 0 V | 0 V |
| Off-state | −2.5 V | −2.5 V | 0 V |

Figure 1B:
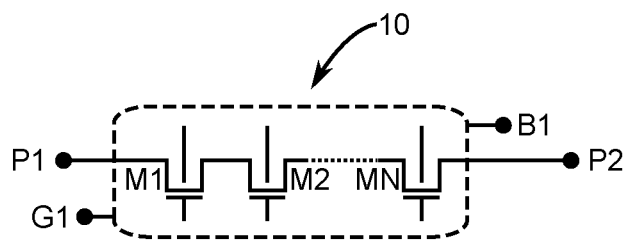
FIG. 1B is a simplified schematic of a prior art switch branch of FIG. 1A configured to switch radio frequency signals.
Figure 1C:
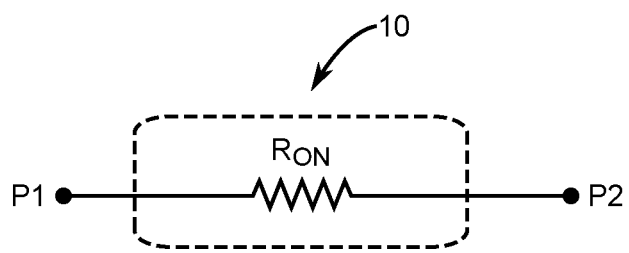
FIG. 1C is a schematic of the simplified prior art switch branch depicting an on-state resistance of the prior art switch branch while in an on-state.

FIG. 1B is a schematic of a simplified prior art switch branch 10 that is configured to switch radio frequency signals between a first port terminal P1 and a second port terminal P2. The prior art switch branch 10 is made up of a stack of field-effect transistors M1 through MN coupled in series drain-to-source between the first port terminal P1 and the second port terminal P2, where N is a finite whole counting number. The prior art switch branch 10 has an on-state in which the field-effect transistors M1 through MN have conductive channels that allow a radio frequency signal to pass between the first port terminal P1 and the second port terminal P2. As depicted in FIG. 1C, the simplified prior art switch branch 10 has an on-state resistance $R_{ON}$ that is a total resistance equal to a sum of drain-to-source resistances of each of the field-effect transistors M1 through MN in the on-state. It is to be understood that on-state parasitic capacitances and on-state parasitic inductances are associated with the prior art switch branch 10. However, the on-state parasitic capacitances and on-state parasitic inductances are relatively small and are not depicted in FIG. 1C.

Figure 1D:
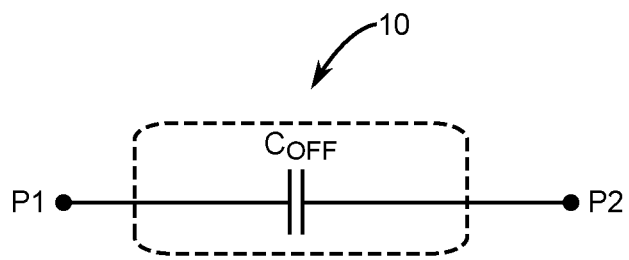
FIG. 1D is a schematic of the simplified prior art switch branch depicting an off-state capacitance of the prior art switch branch while in an off-state.

FIG. 1D is a schematic of the simplified prior art switch branch 10 depicting an off-state capacitance $C_{OFF}$ of the prior art switch branch 10 while the prior art switch branch 10 is in an off-state. It is to be understood that other off-state parasitic capacitances and off-state parasitic inductances are associated with the prior art switch branch 10. However, these other off-state parasitic capacitances and off-state parasitic inductances are relatively small and are not depicted in FIG. 1D. In the off-state, the channels of the field-effect transistors M1 through MN are non-conductive and prevent a radio frequency signal from passing between the first port terminal P1 and the second port terminal P2. However, each of the field-effect transistors M1 through MN contributes to the off-state capacitance $C_{OFF}$ while the prior art switch branch 10 is in the off-state. As frequency of a radio frequency signal applied to the prior art switch branch 10 increases into millimeter wavelength frequencies, off-state capacitive reactance $Z_{OFF}=1/(j\omega C_{OFF})$ of the prior art switch branch 10 decreases to a value in which the first port terminal P1 is not effectively isolated from the second port terminal P2. As a result, the radio frequency signal undesirably passes between the first port terminal P1 and the second port terminal P2 even while the prior art switch branch 10 is in the off-state. Prior art attempts to solve this lack of effective isolation problem for radio frequency signals in the millimeter wavelength region have been unsuccessful.

Figure 2A:
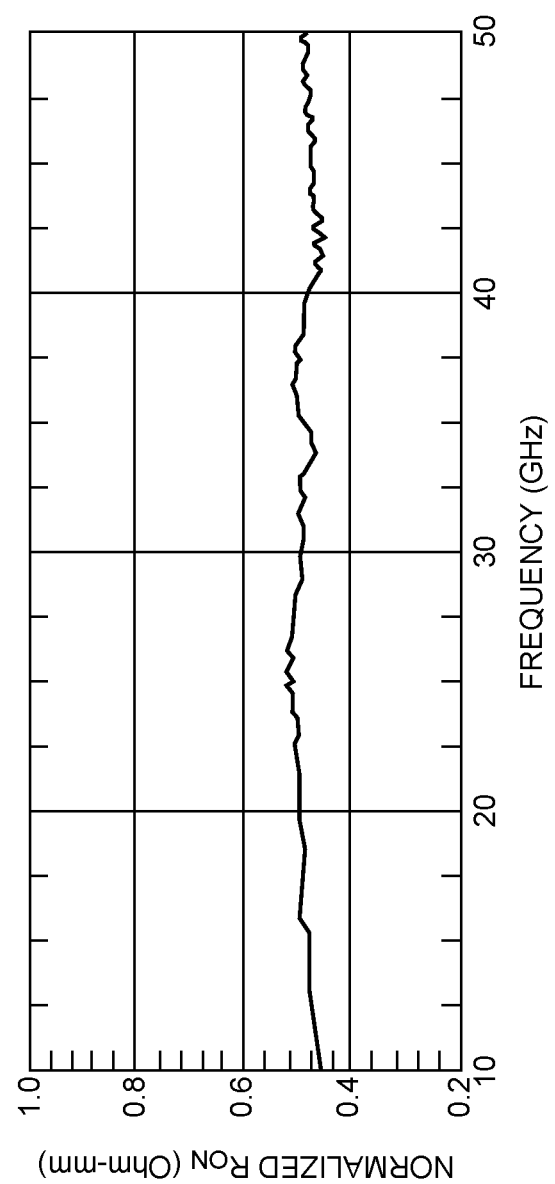
FIG. 2A is a graph of normalized on-state resistance for the prior art switch branch versus millimeter wave frequencies.
Figure 2B:
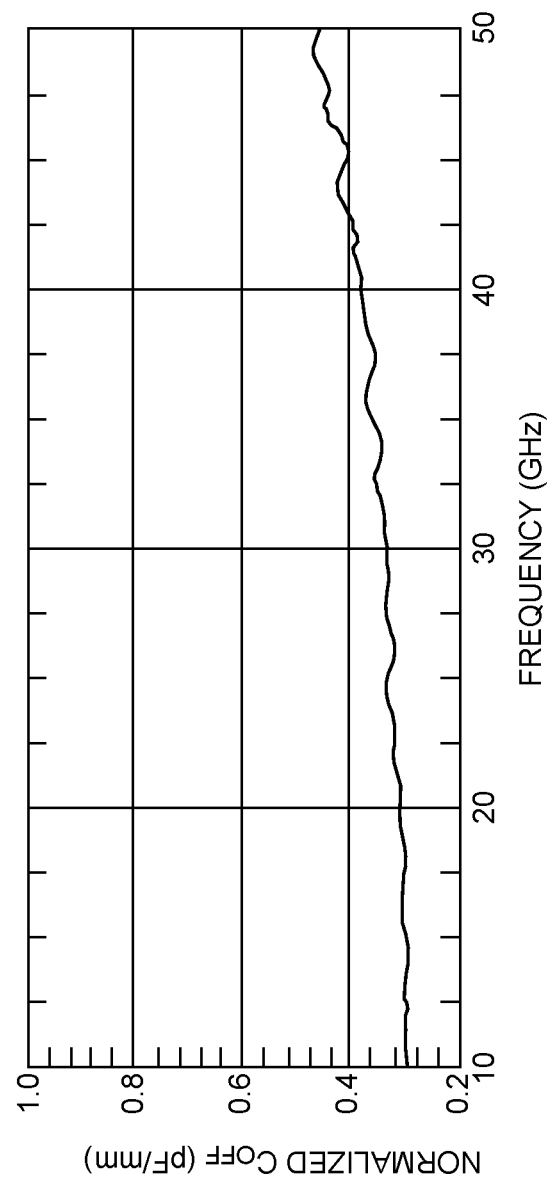
FIG. 2B is a graph of normalized off-state capacitance for the prior art switch branch versus millimeter wave frequencies.
Figure 2C:
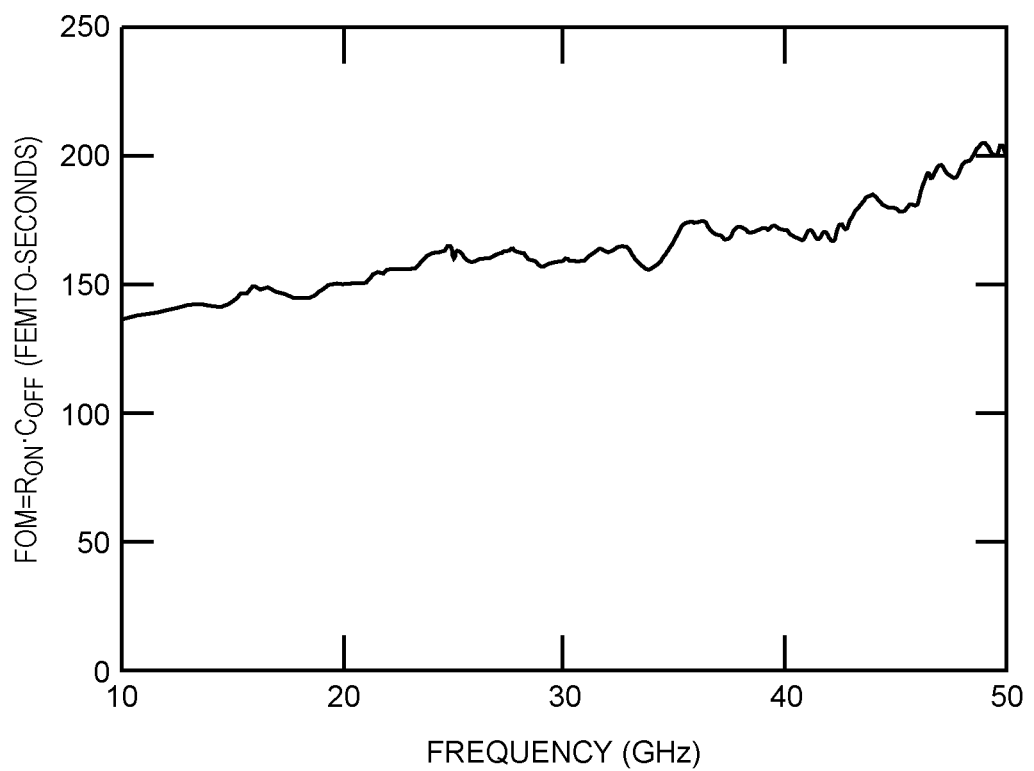
FIG. 2C is a graph of a figure of merit that is a product of on-state resistance and off-state capacitance for the prior art switch branch versus millimeter wave frequencies.

FIGS. 2A and 2B taken together with FIG. 2C illustrate an extent of the aforementioned lack of effective isolation problem for the prior art switch branch 10 when the switching of radio frequency signals is in the millimeter wavelength region. In particular, FIG. 2A is a graph of normalized on-state resistance $R_{ON}$ for the prior art switch branch 10 versus millimeter wave frequencies. FIG. 2B is a graph of normalized off-state capacitance $C_{OFF}$ for the prior art switch branch 10 versus millimeter wave frequencies. In this example, the prior art switch branch 10 is constructed using 110 nm silicon-on-insulator fabrication processes. Measured data for this 110 nm version of the prior art switch branch 10 yields an average value of 0.45 ohm-mm for the on-state resistance $R_{ON}$ and an average of 400 femtofarads (fF)/mm for the off-state capacitance $C_{OFF}$ between 40 GHz and 50 GHz. Thus, for an insertion loss limited to 0.5 dB, the prior art switch branch 10 should have an on-state resistance $R_{ON}$ that is no greater than 4.5 ohms. Therefore, a gate width for the prior art switch branch 10 should be (0.45 ohm-mm)/(4.5 ohm), which is 0.1 mm. Correspondingly, the off-state capacitance $C_{OFF}$ is (400 fF/mm)·(0.1 mm), which is 40 fF. FIG. 2C is a graph of a figure of merit (FOM) that is a product of on-state resistance and off-state capacitance for the prior art switch branch 10 versus millimeter wave frequencies. It is to be understood that this example of prior art switch branch 10 applies to a single stack switch branch. However, the measured data for the single stack switch branch can be scaled to apply to any finite number of stacks. For example, a four stack switch branch with 0.4 mm device sizes would also result in an on-state resistance of 4.5Ω and an off-state capacitance of 40 fF.

FIG. 3A is a schematic of an on-state simulation circuit for the prior art switch branch 10 represented as the on-state resistance $R_{ON}$ of 4.5Ω between the first port terminal P1 and the second port terminal P2. A 50Ω source impedance ZS is coupled between the first port terminal P1 at a first node N1 and ground, and a 50Ω load impedance ZL is coupled between the second port terminal P2 at a second node N2 and ground. FIG. 3B is a schematic of an off-state simulation circuit for the prior art switch branch 10 represented as the off-state capacitance $C_{OFF}$ of 40 fF between the first port terminal P1 and the second port terminal P2. The 50Ω source impedance ZS is coupled between the first port terminal P1 at a third node N3 and ground, and the 50Ω load impedance ZL is coupled between the second port terminal P2 at a fourth node N4 and ground. The simulation circuit of FIG. 2A is used to determine scattering parameters S21 and S11 associated with the first node N1 and the second node N2. The simulation circuit of FIG. 2B is used to determine the scattering parameter S43 associated with the third node N3 and the fourth node N4.

FIG. 3C is a graph of power gain depicted in dot-dash line, insertion loss depicted in dash line, and isolation depicted in solid line, all of which are plotted from simulations of the on-state simulation circuit of FIG. 3A and the off-state simulation circuit of FIG. 3B. At a marker MK1 at which a simulated frequency of a radio frequency signal is 38.5 GHz, the isolation is an unacceptable 3 dB. A primary reason for this low isolation value despite a narrow gate width of 0.1 mm is due to relatively very low capacitive reactance of $-j103\Omega$ for the off-state capacitance $C_{OFF}$ of 40 fF at 38.5 GHz. In addition, an off-state to on-state impedance ratio is near 17 at the simulated frequency of 38.5 GHz. For certain applications such as antenna tuning, an off-state to on-state impedance ratio of 17 would typically be impractically low to meet the fifth-generation (5G) performance specification. As such, there is a need for radio frequency switch circuitry that has a practical off-state to on-state impedance ratio to meet the demands of new wireless standards such as the 5G standard.

Figure 4:
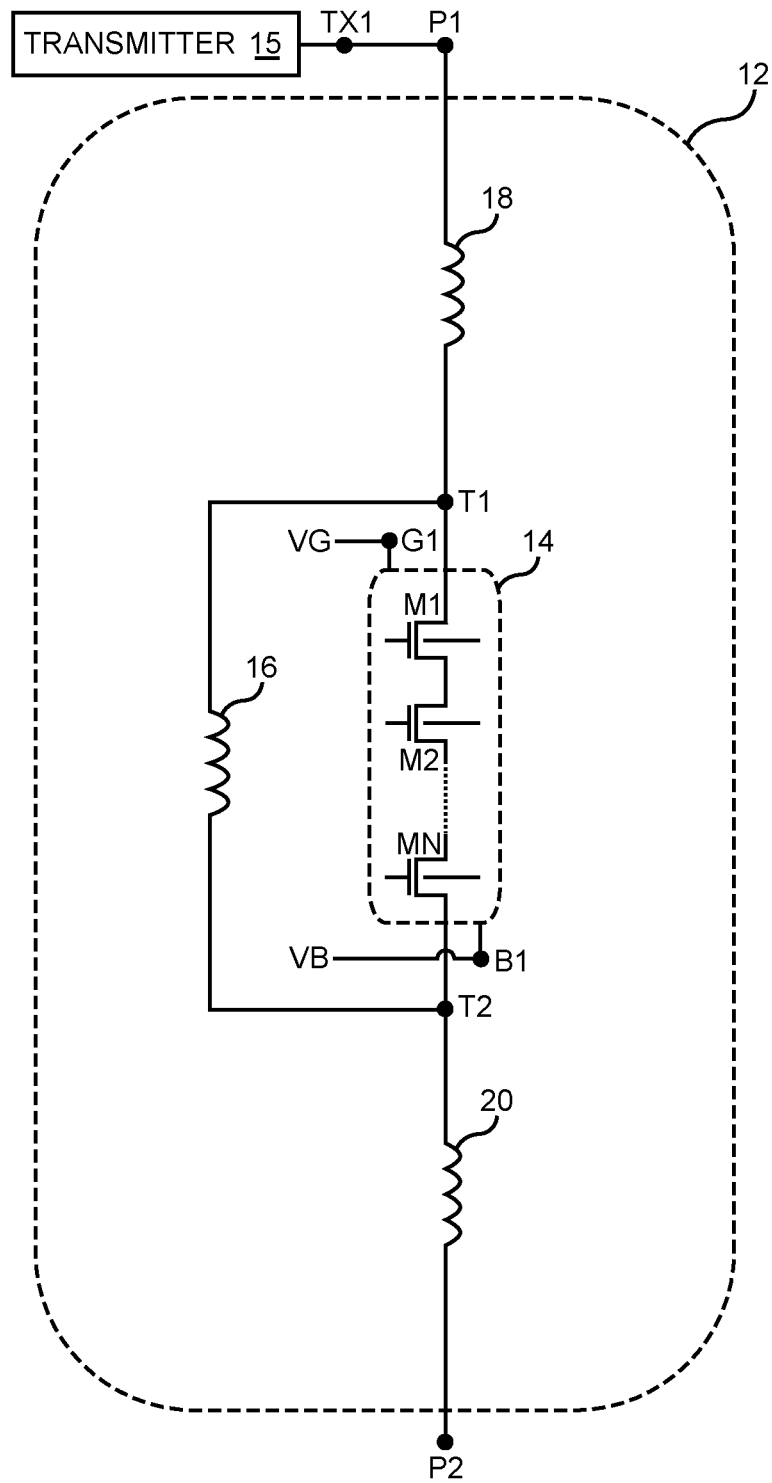
FIG. 4 is a schematic of an embodiment of radio frequency switch circuitry that in accordance with the present disclosure provides a high off-state to on-state impedance ratio for a switch branch.

FIG. 4 is a schematic of an embodiment of radio frequency switch circuitry 12 that in accordance with the present disclosure provides a high off-state to on-state impedance ratio for a switch branch 14 while maintaining maximum isolation with the switch branch 14 in the off-state and minimal insertion loss in the switch branch 14 in the on-state. The switch branch 14 has a first branch terminal T1 coupled to a first signal port P1 and a second branch terminal T2 coupled to a second signal port P2. A transmitter 15 has a transmit terminal TX1 coupled to the first signal port P1, wherein the transmitter 15 is configured to transmit a first radio frequency signal having a first frequency that is different from a second frequency. In at least some embodiments, the first frequency and the second frequency are within a frequency range that extends from 26 GHz to 66 GHz.

Moreover, in this exemplary embodiment, the switch branch 14 remains made up of the stack of field-effect transistors M1 through MN coupled in series drain-to-source between the first branch terminal T1 and the second branch terminal T2, where N is a finite whole counting number. It is to be understood that the switch branch 14 can be based upon silicon-on-insulator technology and high electron mobility technology.

The switch branch 14 has both an on-state and an off-state to control passage of a radio frequency signal between the first signal port P1 and the second signal port P2 in response to a gate bias voltage VG applied to a gate terminal G1 and a body bias voltage VB applied to a body terminal B1. In this exemplary embodiment, each of the field-effect transistors M1 through MN has a gate coupled to the gate terminal G1. In this exemplary embodiment, whenever the gate bias voltage is a positive voltage (e.g., +2.5 V) applied to the gate terminal G1 and the body bias voltage VB is a zero voltage applied to the body terminal B1, channels of the field-effect transistors M1 through MN become conductive, placing the switch branch 14 into the on-state. When the gate bias voltage is a negative voltage (e.g., −2.5 V) applied to the gate terminal G1 and the body bias voltage is a negative voltage (e.g., −2.5 V) applied to the body terminal B1, channels of the field-effect transistors M1 through MN become non-conductive, placing the switch branch 14 into the off-state.

The radio frequency switch circuitry 12 further includes an isolation inductor 16 coupled between the first branch terminal T1 and the second branch terminal T2 such that the isolation inductor 16 is in parallel with the switch branch 14. The isolation inductor 16 has a given inductance that provides resonance with a total off-state capacitance of the switch branch 14 in the off-state at a given frequency, which is between the first frequency and the second frequency. A first port inductor 18 depicted coupled between the first port terminal P1 and the first branch terminal T1 represents inductance associated with a first bonding element of the first signal port P1 between the first signal port P1 and the switch branch 14. The first bonding element is typically a bond wire or solder bump. A second port inductor 20 depicted coupled between the second port terminal P2 and the second branch terminal T2 represents inductance associated with a second bonding element of the second signal port P2 between the second signal port P2 and the switch branch 14. Similar to the first bonding element, the second bonding element is typically a bonding wire or solder bump.

Figure 5A:
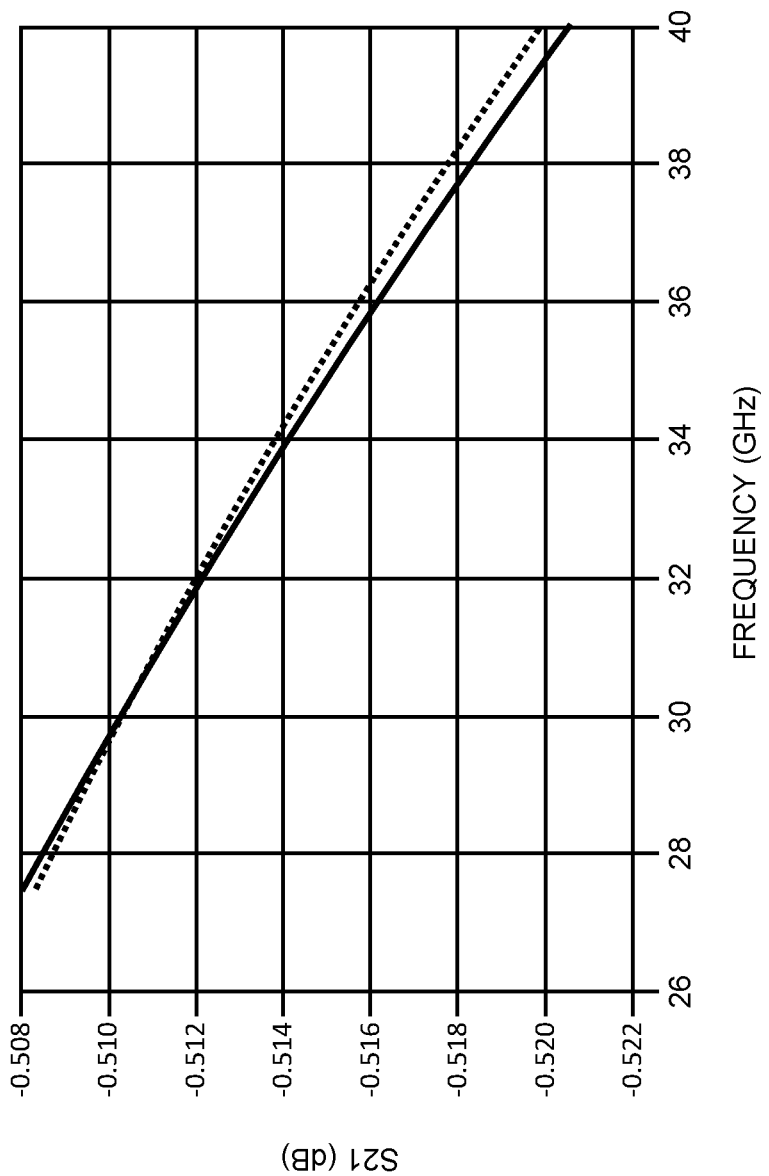
FIG. 5A is a graph of insertion loss for the radio frequency switch circuitry with and without an isolation inductor.

FIG. 5A is a graph of insertion loss for the radio frequency switch circuitry 12 with and without the isolation inductor 16. Insertion loss without the isolation inductor 16 is depicted in dotted line, and insertion loss with the isolation inductor 16 coupled in parallel with the switch branch is depicted in solid line. Notice that there is no practical increase in insertion loss due to the addition of the isolation inductor. In particular, insertion loss of the isolation inductor 16 and switch branch 14 coupled in parallel between the first signal port P1 and the second signal port P2 is no greater than within 5% of 0.5 dB.

Figure 5B:
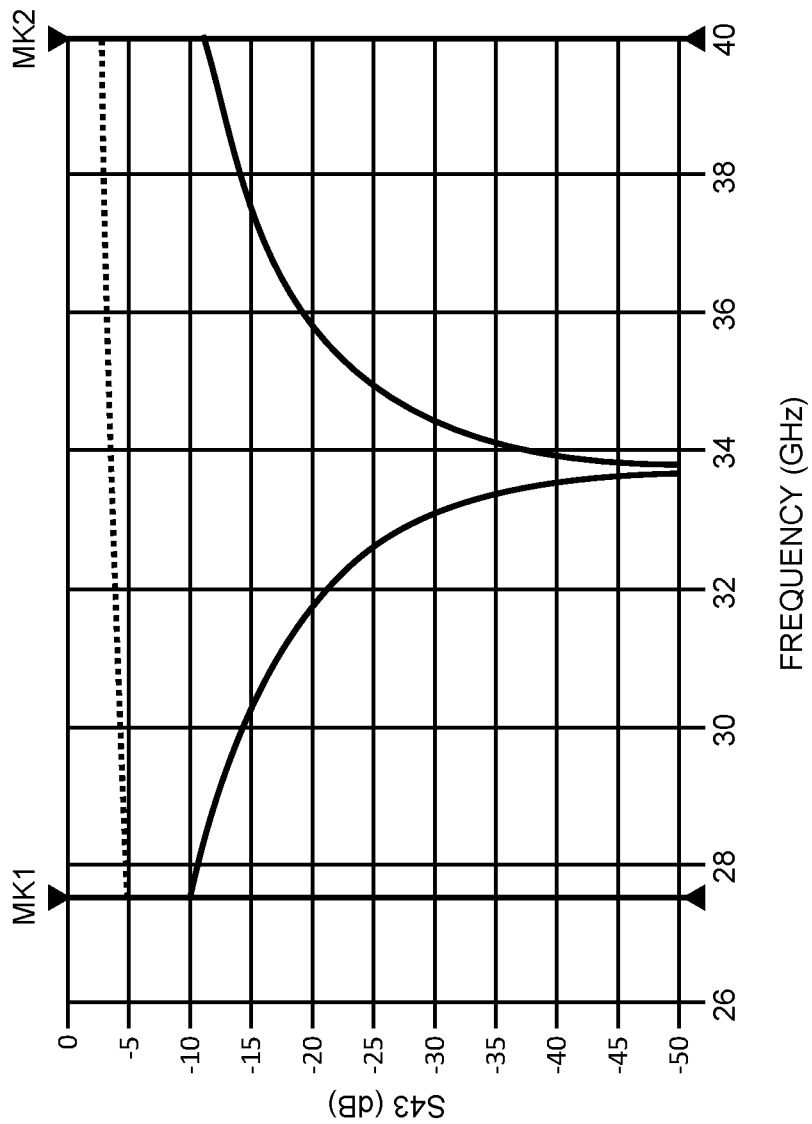
FIG. 5B is a graph of isolation provided by placing the isolation inductor in parallel with the switch branch and isolation provided by the switch branch alone.

FIG. 5B is a graph of isolation provided by placing the isolation inductor 16 in parallel with the switch branch 14 and isolation provided by the switch branch 14 alone. The isolation provided by the switch branch 14 alone without the presence of isolation inductor 16 is depicted in dotted line, and the isolation provided by the isolation inductor 16 coupled in parallel with the switch branch 14 is depicted in solid line. The isolation between the first port terminal P1 and the second port terminal P2 provided by the switch branch 14 alone at a signal frequency of 27.5 GHz at marker MK1 does not exceed 5 dB, and the isolation decreases to 2.5 dB at a signal frequency of 40 GHz at marker MK2. This low amount of isolation between the first port terminal P1 and the second port terminal P2 would be unacceptable in most switching applications. In contrast, the isolation inductor 16 provides isolation of at least 10 dB between the first port terminal P1 and the second port terminal P2 over a signal bandwidth of 12 GHz within a frequency range between 27.5 GHz and 40 GHz when the switch branch 14 is in the off-state. Moreover, the isolation inductor 16 provides isolation of at least 20 dB between the first port terminal P1 and the second port terminal P2 over a signal bandwidth of 4 GHz within the frequency range between 27.5 GHz and 40 GHz when the switch branch 14 is in the off-state. Notice also that the isolation inductor 16 provides isolation of at least 30 dB between the first port terminal P1 and the second port terminal P2 over a signal bandwidth of 1.5 GHz within the frequency range between 27.5 GHz and 40 GHz when the switch branch 14 is in the off-state. In fact, isolation between the first port terminal P1 and the second port terminal P2 is as much as 50 dB for a signal frequency of 33.8 GHz.

Figure 5C:
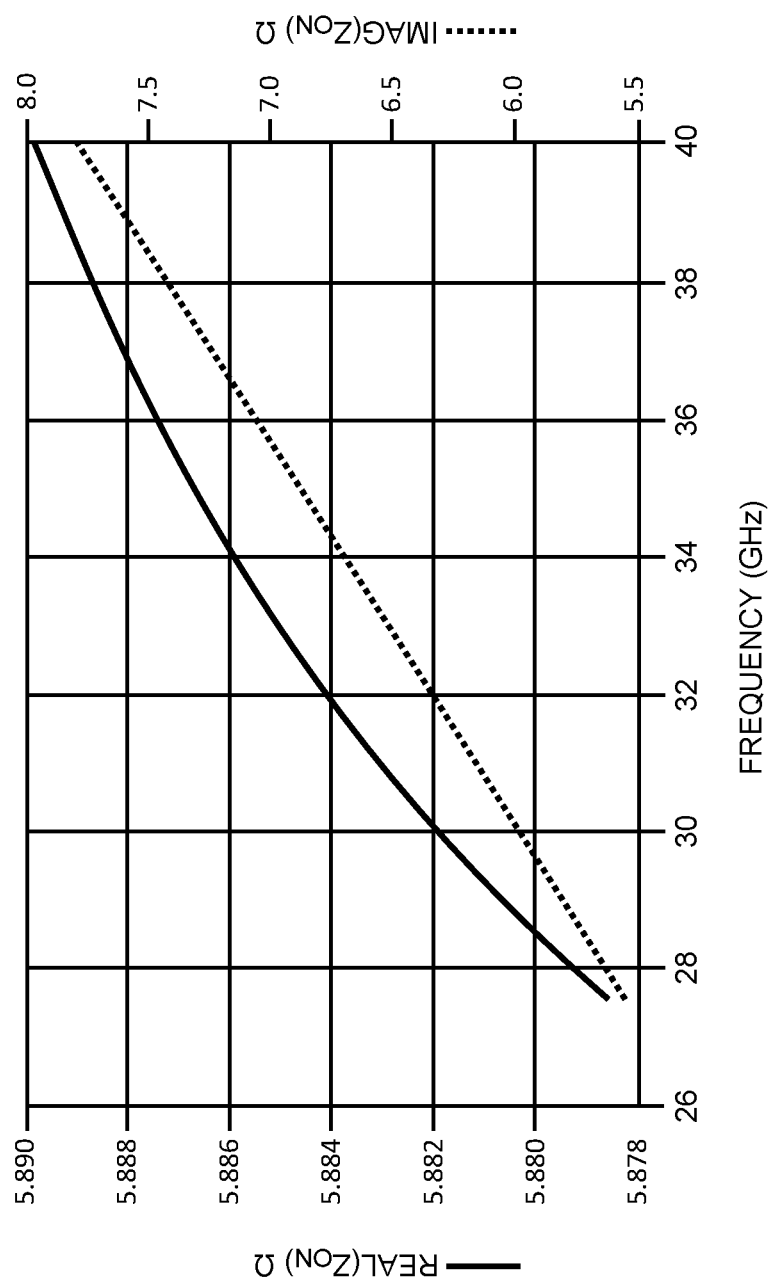
FIG. 5C is a graph of real and imaginary parts of on-state impedance for the radio frequency switch circuitry of FIG. 4.
Figure 5D:
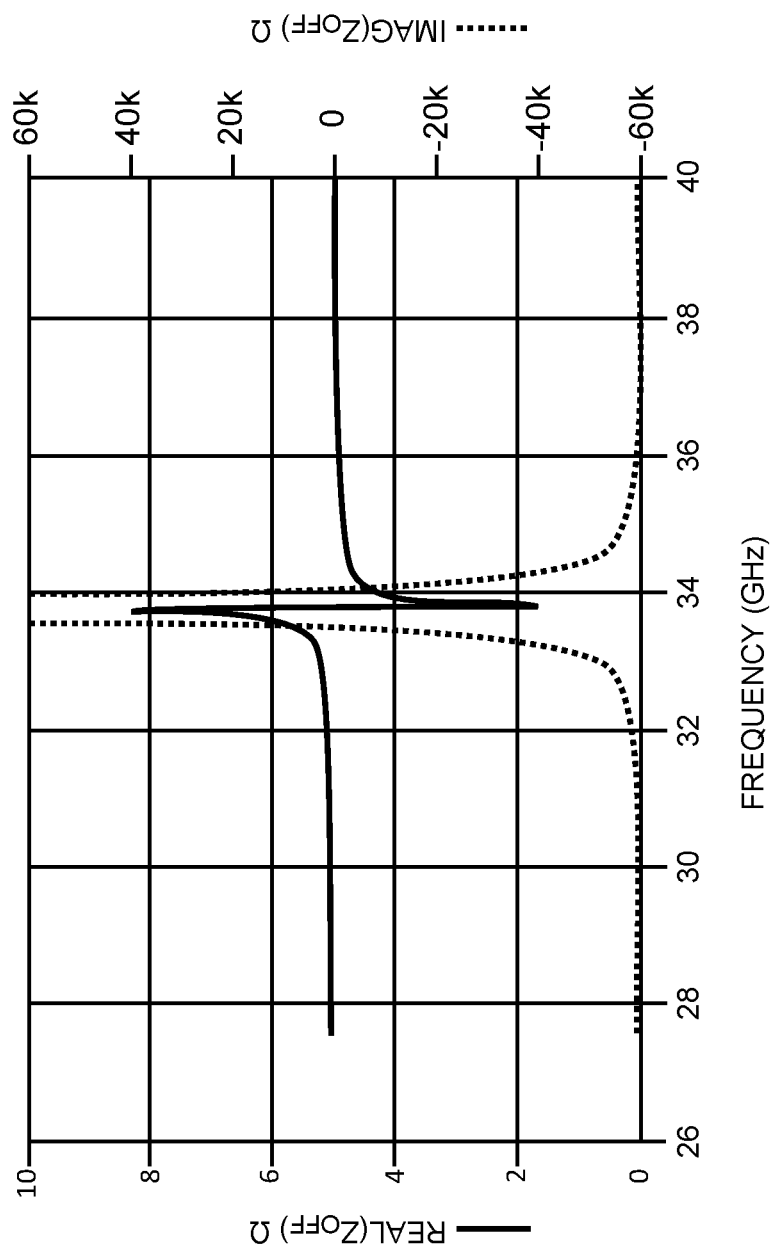
FIG. 5D is a graph of real and imaginary parts of off-state impedance for the radio frequency switch circuitry of FIG. 4.

FIG. 5C is a graph of real and imaginary parts of on-state impedance $Z_{ON}$ for the radio frequency switch circuitry 12 of FIG. 4. FIG. 5D is a graph of real and imaginary parts of off-state impedance $Z_{OFF}$ for the radio frequency switch circuitry 12 of FIG. 4. As can be determined from the graphs of FIG. 5C and FIG. 5D, a minimum off-state to on-state impedance ratio (|Zoff|/|Zon|) is 35, which is over twice the maximum off-state to on-state impedance ratio (|Zoff|/|Zon|) of 17 for the prior art switch branch 10 of FIG. 1. In particular, a ratio of off-state impedance between the first signal port P1 and the second signal port P2 and on-state impedance between the first signal port P1 and the second signal port P2 is at least 35 for a signal frequency between 26 GHz and 40 GHz.

Figure 6:
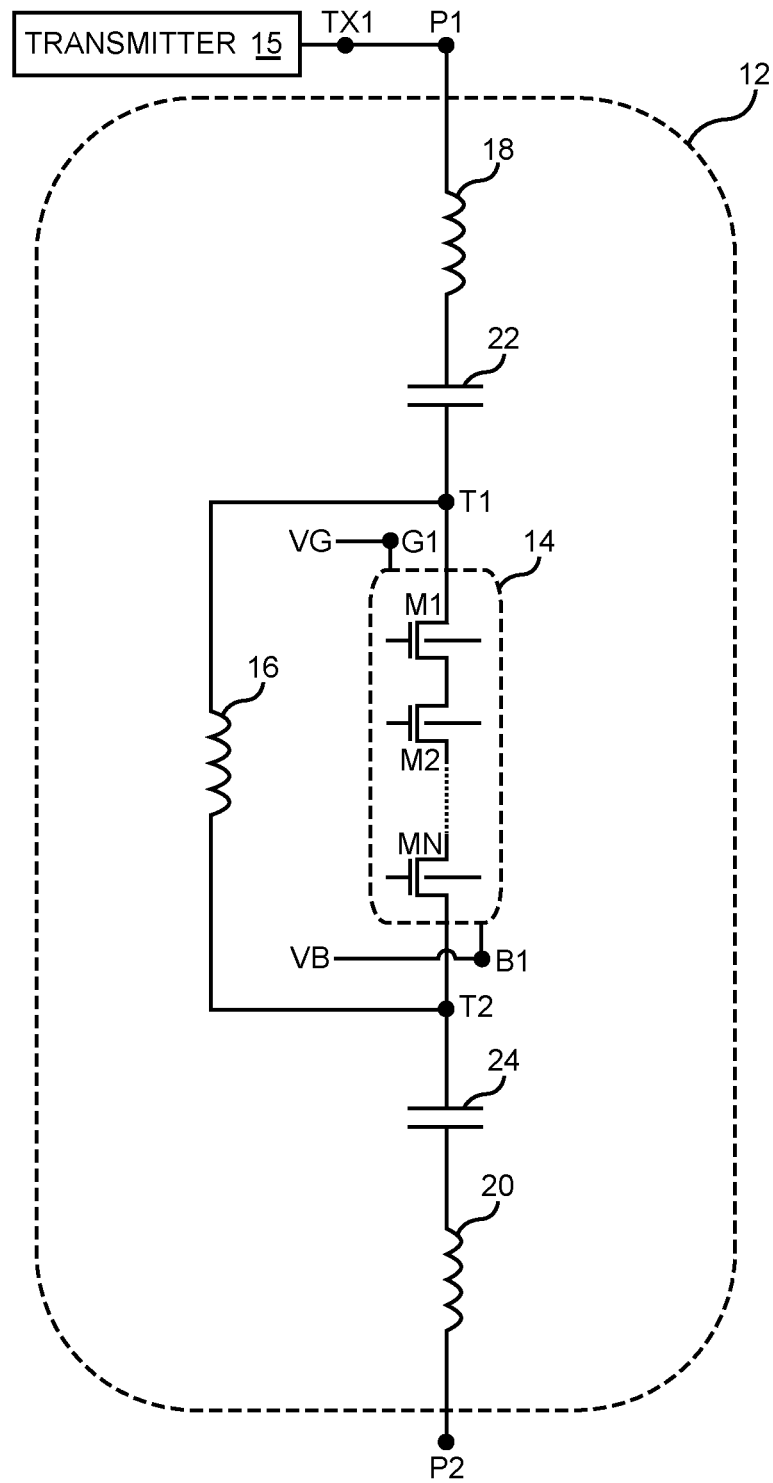
FIG. 6 is a schematic of another embodiment of the radio frequency switch circuitry that includes a first series capacitor and a second series capacitor for resonating with the first port inductor and the second port inductor.
Figure 7:
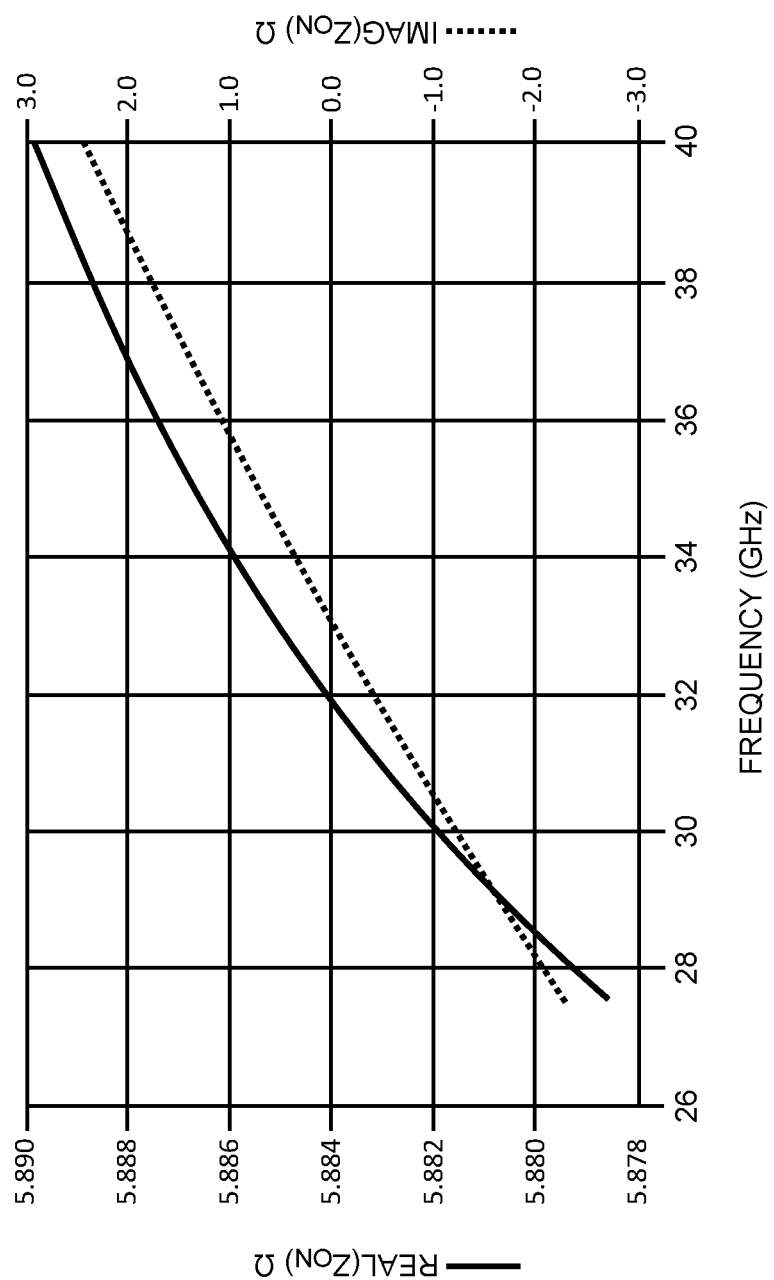
FIG. 7 is a graph of the real and imaginary parts of on-state impedance with the first series capacitor and the second series capacitor added to the radio frequency switch circuitry.

FIG. 6 is a schematic of another embodiment of the radio frequency switch circuitry 12 that includes a first series capacitor 22 and a second series capacitor 24 for resonating with the first port inductor 18 and the second port inductor 20. The first series capacitor 22 is coupled in series with the first port inductor 18 and the first branch terminal T1. The second series capacitor 24 is coupled in series with the second port inductor 20 and the second branch terminal T2. Both the first series capacitor 22 and the second series capacitor 24 were simulated with a capacitance of 1.48 pF each. As such, the reactive part of on-state impedance $Z_{ON}$ can be centered on zero as depicted in FIG. 7, which is a graph of the real and imaginary parts of on-state impedance $Z_{ON}$ with the first series capacitor 22 and the second series capacitor 24 added to the radio frequency switch circuitry 12. The first series capacitor 22 and the second series capacitor 24 resonate with the first port inductor 18 and the second port inductor 20, respectively, to increase the off-state to on-state impedance ratio over the embodiment of FIG. 4 by at least 30%. In particular, the ratio of off-state impedance between the first signal port P1 and the second signal port P2 and on-state impedance between the first signal port P1 and the second signal port P2 is at least 45 for a signal frequency between 26 GHz and 40 GHz. Moreover, in the exemplary embodiment at around a signal frequency of 33.8 GHz, the off-state to on-state impedance ratio is around 46.

Figure 8:
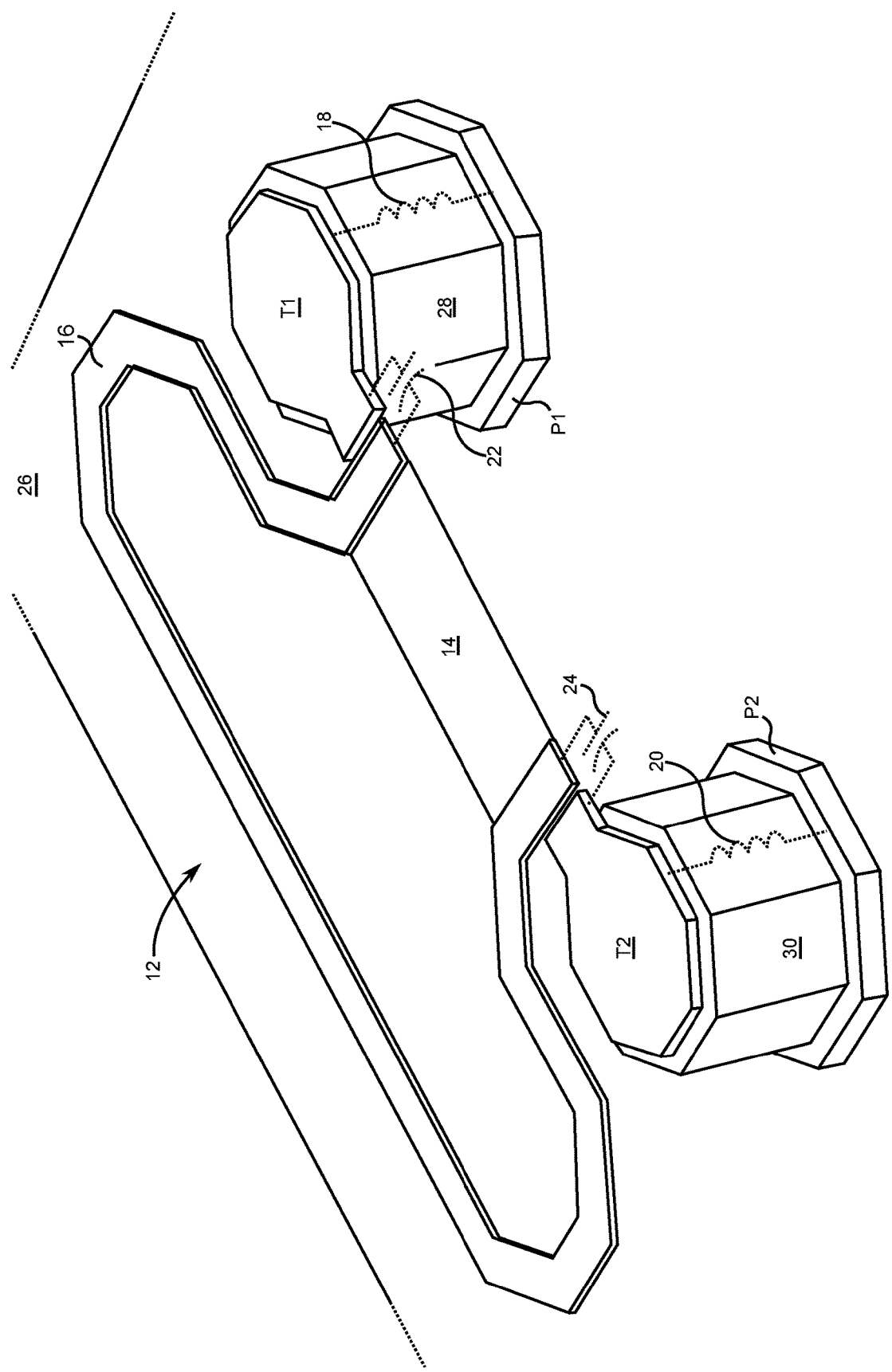
FIG. 8 is a three-dimensional structural view of the radio frequency switch circuitry of FIG. 6.

FIG. 8 is a three-dimensional structural view of the radio frequency switch circuitry 12 of FIG. 6 that is integrated within an integrated circuit die 26. In this exemplary embodiment, the isolation inductor 16 is depicted as a single loop inductor fabricated from a metal trace that may be within a third metal layer of the integrated circuit die 26. In this three-dimensional structural view, the first port inductor 18, the second port inductor 20, the first series capacitor 22, and the second series capacitor 24 are all depicted symbolically in dashed line. In this exemplary embodiment, the first port inductor 18 is a first solder bump 28 that couples the first branch terminal T1 to the first port terminal P1, and the second port inductor 20 is a second solder bump 30 that couples the second branch terminal T2 to the second port terminal P2.

Figure 9:
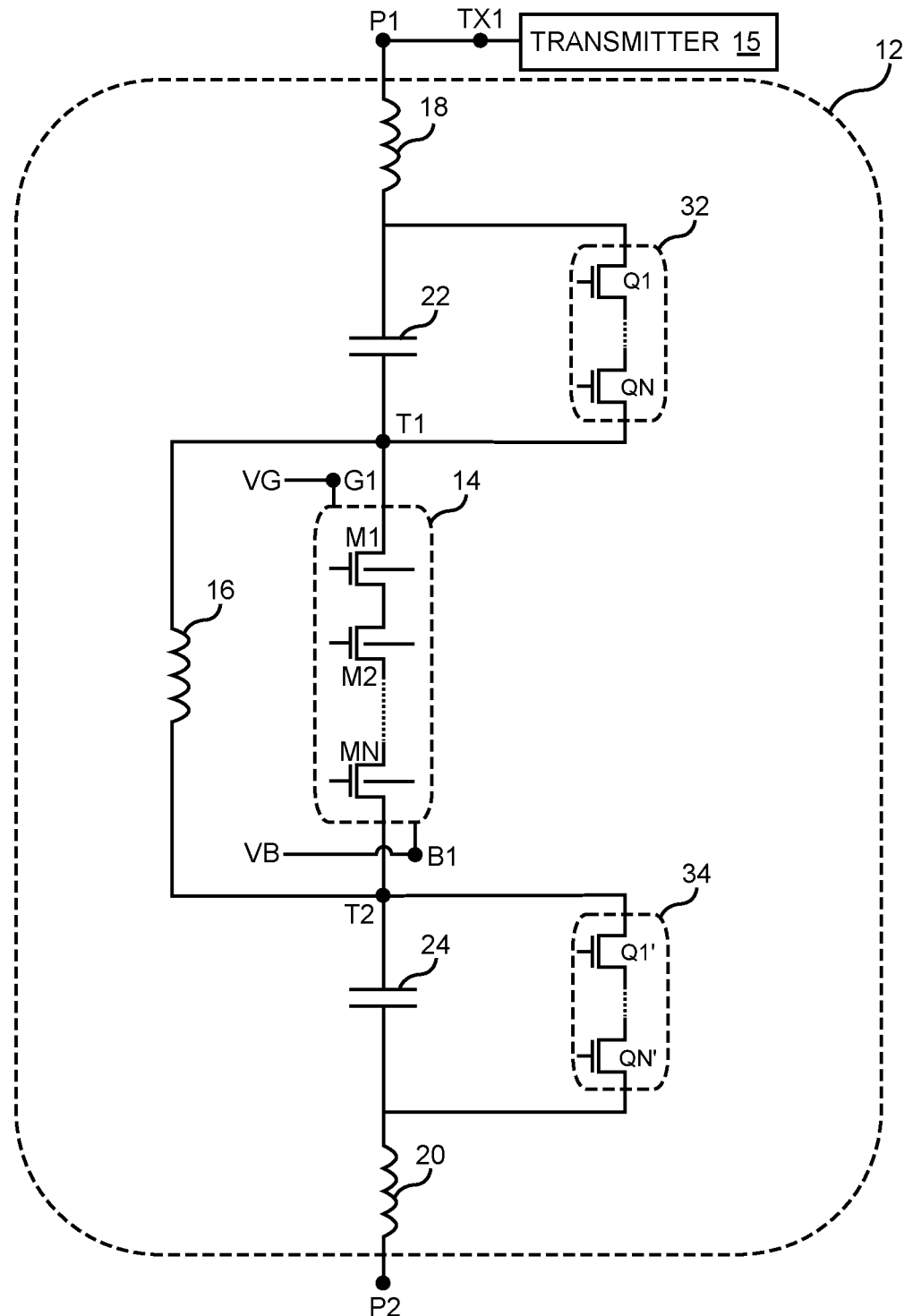
FIG. 9 is a schematic of an exemplary embodiment of the radio frequency switch circuitry that adds a first electrostatic discharge (ESD) shunting branch and a second ESD shunting branch that are configured to shunt ESD energy away from ESD-sensitive parts.

The first series capacitor 22 and the second series capacitor 24 may present electrostatic discharge (ESD) weak points that could potentially result in irreparable damage to the radio frequency switch circuitry 12 during an ESD event. As depicted in FIG. 9, yet another exemplary embodiment of the radio frequency switch circuitry 12 adds a first ESD shunting branch 32 and a second ESD shunting branch 34 that are configured to shunt ESD energy away from the first series capacitor 22 and the second series capacitor 24. The first ESD shunting branch 32 is made up of a second stack of transistors Q1 through QN, where N is a finite whole counting number. The second ESD shunting branch 34 is made up of a third stack of transistors Q1' through QN'. In operation, the first stack of transistors Q1 through QN of the first ESD shunting branch 32 and the second stack of transistors Q1' through QN' of the second ESD shunting branch 34 are in their off-state and do not load the switch branch 14 because practically all of a radio frequency (RF) signal's current is passed by the first series capacitor 22 and the second series capacitor 24. However, during an ESD event the first ESD shunting branch 32 and the second ESD shunting branch 34 provide enough leakage current pathway for ESD current to be shunted around the ESD-sensitive first series capacitor 22 and the second series capacitor 24.

Figure 10:
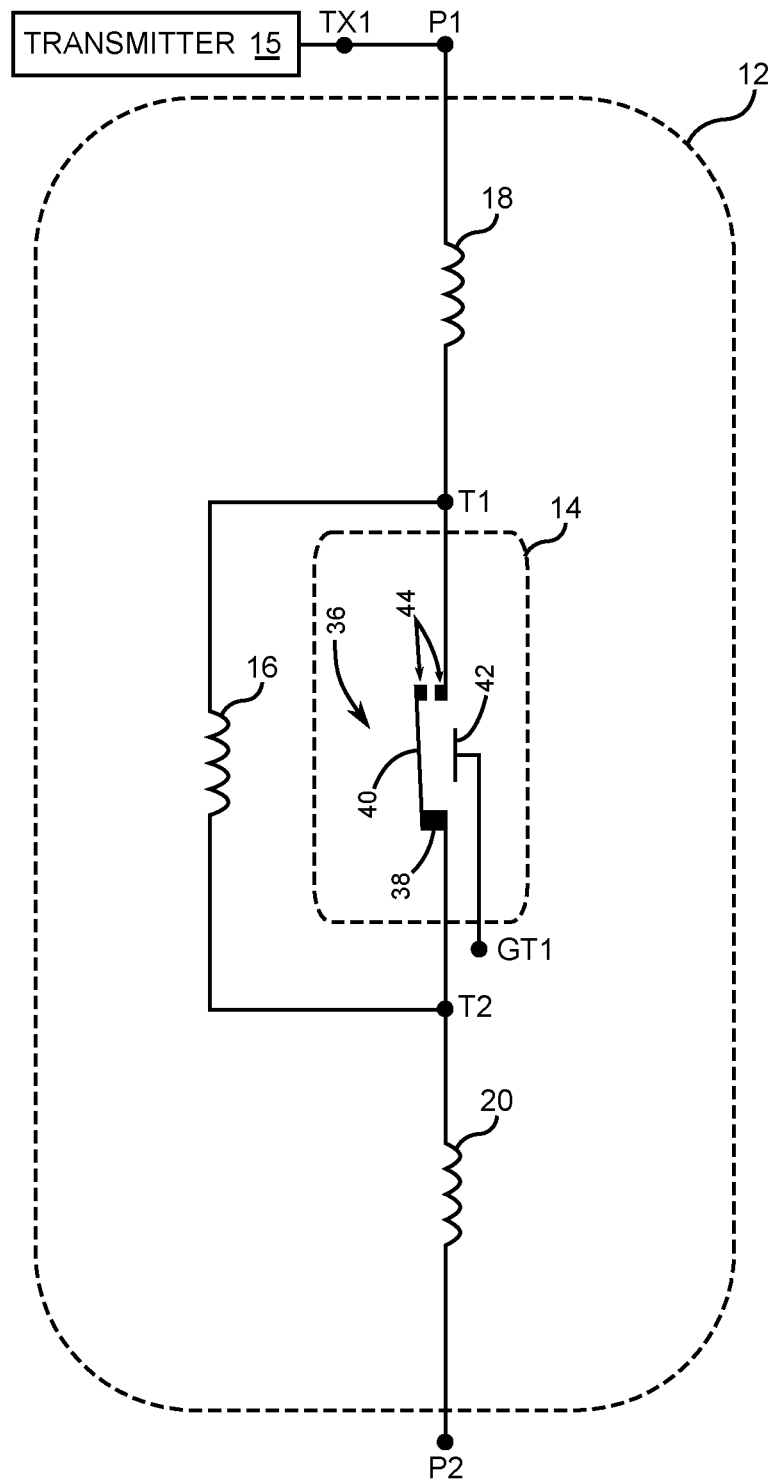
FIG. 10 is a schematic of an exemplary embodiment of the radio frequency switch circuitry in which the switch branch is a microelectromechanical systems (MEMS) switch device.

FIG. 10 is a schematic of an exemplary embodiment of the radio frequency switch circuitry 12 in which the switch branch 14 is a microelectromechanical systems (MEMS) switch device 36 that has a parasitic source-to-drain capacitance that resonates with the isolation inductor 16 to improve isolation when the MEMS switch device 36 is in an off-state. The MEMS switch device 36 has an anchor 38 with an attached cantilever 40. An actuator plate 42 positioned opposite to the cantilever 40 is coupled to a gate control terminal GT1. During operation, an on-state control signal applied to the gate control terminal GT1 energizes the actuator plate 42. In response to the energized actuator plate, the cantilever 40 is electrostatically pulled towards the actuator plate 42, which results in the closure of electrical contacts 44. Once the electrical contacts 44 are closed, a radio frequency signal pathway between the first port terminal P1 and the second port terminal P2 is formed. In contrast, when an off-state control signal de-energizes the actuator plate 42, the cantilever 40 springs away from the actuator plate 42 and the electrical contacts 44 open. At a given frequency of the radio frequency signal transmitted the transmitter 15, the isolation inductor 16 resonates with parasitic capacitance of the MEMS switch device 36 between the first branch terminal T1 and the second branch terminal T2 to improve isolation between the first port terminal P1 and the second port terminal P2.

Figure 11A:
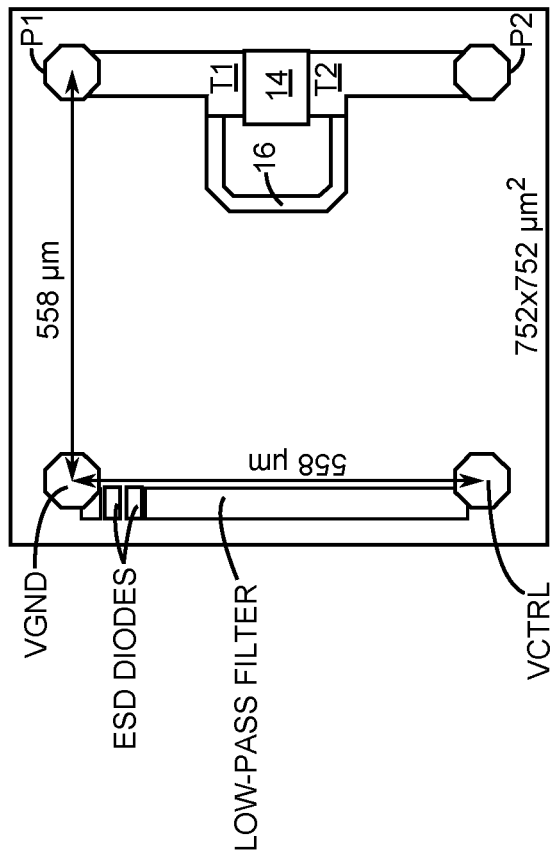
FIG. 11A is a plan view of a 500×500 µm$^2$ version of an integrated circuit die layout of the radio frequency switch circuitry.
Figure 11B:
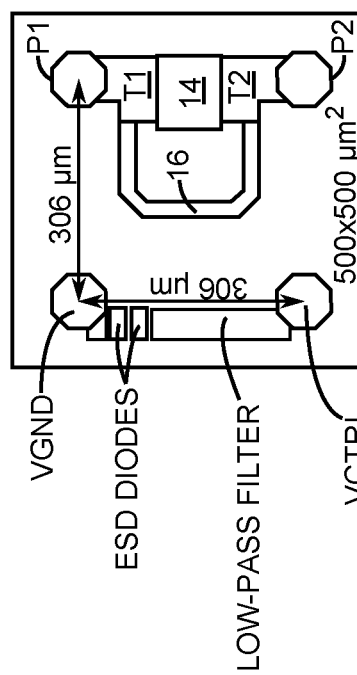
FIG. 11B is a plan view of a 752×500 µm$^2$ version of an integrated circuit die layout of the radio frequency switch circuitry.
Figure 11C:
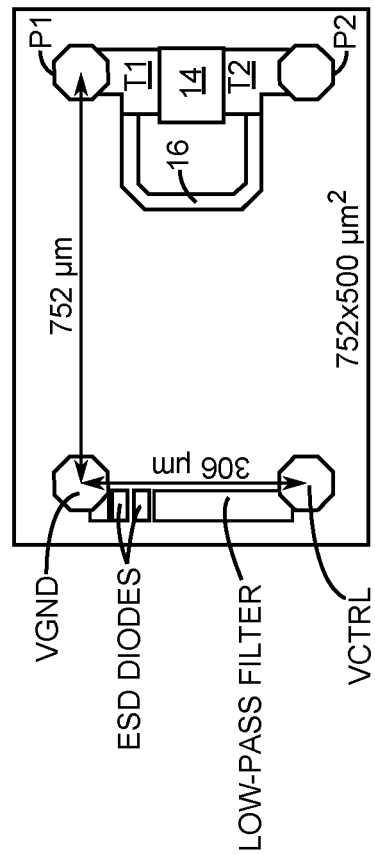
FIG. 11C is a plan view of a 752×752 µm$^2$ version of an integrated circuit die layout of the radio frequency switch circuitry.

FIG. 11A is a plan view of a 500×500 µm² version of an integrated circuit die layout of the radio frequency switch circuitry 12. FIG. 11B is a plan view of a 752×500 µm² version of an integrated circuit die layout of the radio frequency switch circuitry 12. FIG. 11C is a plan view of a 752×752 µm² version of an integrated circuit die layout of the radio frequency switch circuitry 12. Each version of the integrated circuit die layouts includes ESD diodes and a low-pass filter for filtering a control signal. The ESD diodes and low-pass filter are coupled between a control voltage input terminal VCTRL and a ground voltage terminal VGND. A control voltage input terminal VCTRL receives the control signal that transitions the switch branch 14 between the off-state and the on-state and vice versa.

Figure 12:
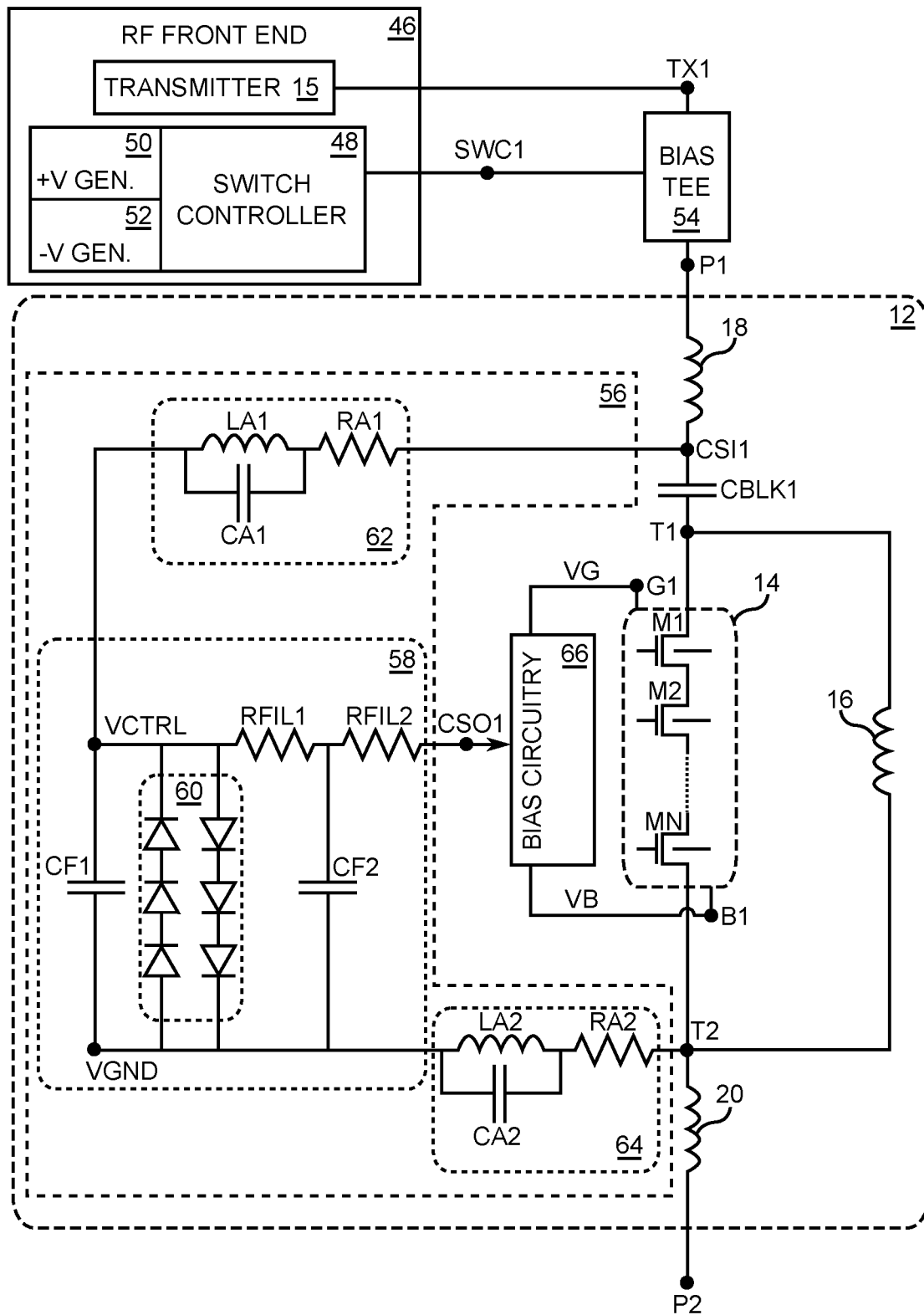
FIG. 12 is a schematic of another exemplary embodiment of the radio frequency circuitry having a configuration that can be considered a two-terminal switch die.

FIG. 12 is a schematic of another exemplary embodiment of the radio frequency switch circuitry 12. This particular embodiment receives a control signal coupled with an RF signal that is switched between the first port terminal P1 and the second port terminal P2 in response to the control signal. An RF front end 46 includes a switch controller 48 that outputs a control signal through a switch control terminal SWC1. The RF front end 46 further includes a positive voltage generator 50 and a negative voltage generator 52, both of which are in communication with the switch controller 48. The RF front end 46 is typically in communication with a base-band processor (not shown) that sends commands to the switch controller 48 for selecting the appropriate on-state or off-state for the switch branch 14.

In the exemplary embodiment of FIG. 12, the positive voltage generator 50 generates a positive voltage level that is selected by the switch controller 48 and provided through the switch control terminal SWC1 to transition the switch branch 14 to the on-state. In contrast, the negative voltage generator 52 generates a negative voltage level that is selected by the switch controller 48 and provided through the switch control terminal SWC1 to transition the switch branch 14 to the off-state. A bias tee 54 that is coupled between the transmit terminal TX1 of the transmitter 15, the switch control terminal SWC1, and the first port terminal P1 combines the RF signal with the control signal. The bias tee 54 couples the control signal with the RF signal to provide a composite signal to the first port terminal P1.

Control signal decoupling circuitry 56 has a control signal input terminal CSI1 coupled to the first port terminal P1 to receive the composite signal and a control signal output terminal CSO1, wherein the control signal decoupling circuitry 56 is configured to decouple the control signal from the RF signal. Moreover, a direct current blocking capacitor CBLK1 is coupled between the control signal input terminal CSI1 and the first branch terminal T1 to block the control signal from entering the switch branch 14 through the first branch terminal T1.

In this particular embodiment, the control signal decoupling circuitry 56 includes control signal conditioning circuitry 58 that is configured to filter the RF signal from the control signal. The control signal conditioning circuitry 58 is coupled between the control voltage input terminal VCTRL and the ground voltage terminal VGND. In this exemplary embodiment, a first low-pass filter is made up of a first filter resistor RFIL1 coupled between the control voltage input terminal VCTRL and the control signal output terminal CSO1 and a first filter capacitor CF1 coupled between the control voltage input terminal VCTRL and the ground voltage terminal VGND. A second low pass filter is made up of a second filter resistor RFIL2 coupled between the first filter resistor RFIL1 and the control signal output terminal CSO1 and a second filter capacitor CF2 coupled between the ground voltage terminal VGND and a node shared by the first filter resistor RFIL1 the second filter resistor RFIL2.

Electrostatic discharge (ESD) shunting diodes 60 coupled between the control voltage input terminal VCTRL and the ground voltage terminal VGND are configured to shunt energy of an ESD event away from the switch branch 14. In the exemplary configuration of FIG. 12, the ESD shunting diodes 60 are arranged in two antiparallel branches that each include three of the ESD shunting diodes coupled in series.

Further included in the control signal decoupling circuitry 56 is a first RF attenuating branch 62 coupled between the control voltage input terminal VCTRL and the control signal input terminal CSI1 to present impedance to the RF signal within a first path that includes the control signal conditioning circuitry 58. The first RF attenuating branch 62 may include a first attenuating resistor RA1 and/or a first attenuating inductor LA1 coupled between the control voltage input terminal VCTRL and the control signal input terminal CSI1. Moreover, a first attenuating capacitor CA1 may be coupled in parallel with the first attenuating inductor LA1 to provide a notch filter to further attenuate the RF signal without appreciably attenuating the control signal.

Further included in the control signal decoupling circuitry 56 is a second RF attenuating branch 64 coupled between the ground voltage terminal VGND and the second branch terminal T2 to present impedance to the RF signal within a second path that includes the control signal conditioning circuitry 58. The second RF attenuating branch 64 may include a second attenuating resistor RA2 and/or a second attenuating inductor LA2 coupled between the ground voltage terminal VGND and the second branch terminal T2. Moreover, a second attenuating capacitor CA2 may be coupled in parallel with the second attenuating inductor LA2 to provide a notch filter to further attenuate the RF signal to prevent the RF signal from being applied to the control signal output terminal CSO1. In an exemplary embodiment, the first attenuating inductor LA1 and the second attenuating inductor LA2 each have an inductance value of 2.84 nH to provide an impedance of 500Ω for an RF signal having a frequency of 28 GHz. In some embodiments, the first RF attenuating branch 62 and the second RF attenuating branch 64 each provide impedance to the RF signal that is at least an order of magnitude greater than the impedance to the RF signal due to either of the first port inductor 18 or the second port inductor 20.

Bias circuitry 66 is coupled between the control signal output terminal CSO1 and the gate terminal G1 and, in this exemplary embodiment, the body terminal B1. The bias circuitry 66 biases both the bodies and the gates of the stack of field-effect transistors M1 through MN that make up switch branch 14 in this particular embodiment. Responsive to the control signal provided by the switch controller 48, the gate bias voltage VG is applied to the gate terminal G1 and the body bias voltage VB is applied to a body terminal B1.

Further still, this embodiment may also include the isolation inductor 16 that has a given inductance that provides resonance with a total off-state capacitance of the switch branch 14 at a center frequency of the RF signal that is within a frequency range that extends from 26 GHz to 66 GHz.

The exemplary embodiment of the radio frequency switch circuitry 12 of FIG. 12 is integrated into a silicon-on-insulator (SOI) die. In this configuration the radio frequency switch circuitry 12 can be considered a two-terminal switch die because only the first port terminal P1 and the second port terminal P2, with the exception of perhaps ground, are external to the die.

Figure 13:
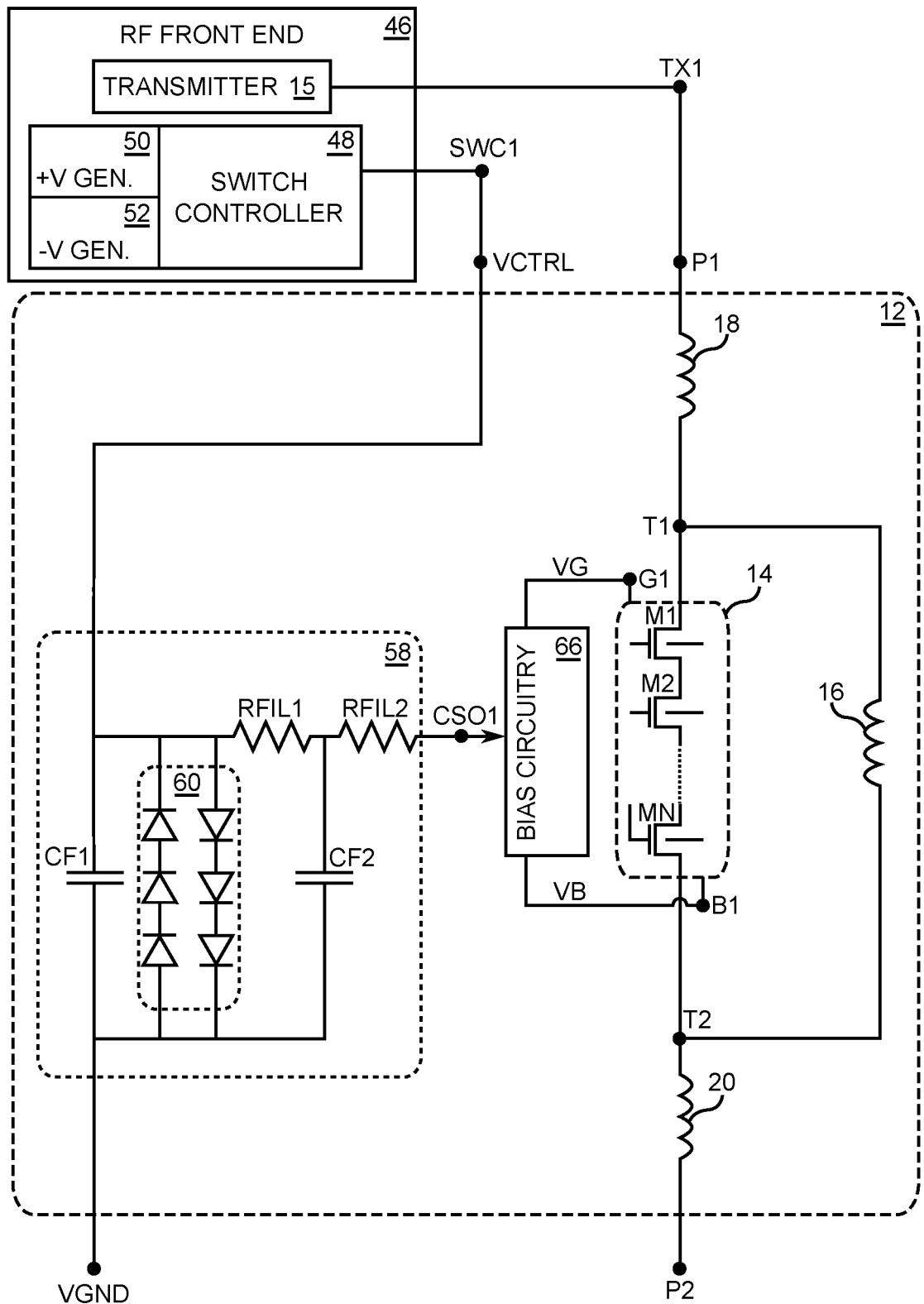
FIG. 13 is an exemplary embodiment of a configuration of the radio frequency switch circuitry having a configuration that can be considered a four-terminal switch die.

FIG. 13 is an exemplary embodiment of a configuration of the radio frequency switch circuitry 12 having a configuration that can be considered a four-terminal switch die. In this particular embodiment, the control voltage input terminal VCTRL is coupled to the switch control terminal SWC1, thereby eliminating a need for the first RF attenuating branch 62 and the second RF attenuating branch 64 of control signal decoupling circuitry 56. However, this reduction comes at a cost of increased pin count over the exemplary embodiment of FIG. 12. The control signal conditioning circuitry 58 remains to provide filtering to the control signal to reduce possible RF noise inadvertently coupled to the control signal. Furthermore, the ESD shunting diodes 60 coupled between the control voltage input terminal VCTRL and the ground voltage terminal VGND remain configured to shunt energy of an ESD event away from the switch branch 14. Still further, this embodiment may also include the isolation inductor 16 that has a given inductance that provides resonance with a total off-state capacitance of the switch branch at a center frequency of the RF signal that is within a frequency range that extends from 26 GHz to 66 GHz. The exemplary embodiment of the radio frequency switch circuitry 12 of FIG. 13 is also integrated into an SOI die. An advantage of any embodiments of the radio frequency switch circuitry 12 of the present disclosure is that no digital signal decoding circuitry is required to be integrated onto a die containing the radio frequency switch circuitry 12. As such, any die containing the radio frequency switch circuitry 12 is at least an order smaller in area than traditional radio frequency switch circuitry that includes digital signal decoding circuitry needed to resolve preambles, addresses, and commands that command operation of radio frequency switches to transition between their open and closed states. Also note that the switch controller 48 and the positive voltage generator 50 and the negative voltage generator 52 are not integrated with the radio frequency switch circuitry 12. Thus, the switch controller 48 and the positive voltage generator 50 and the negative voltage generator 52 are external to the radio frequency switch circuitry 12 and do not take up real estate on the SOI die onto which the radio frequency switch circuitry 12 is integrated.

Figure 14:
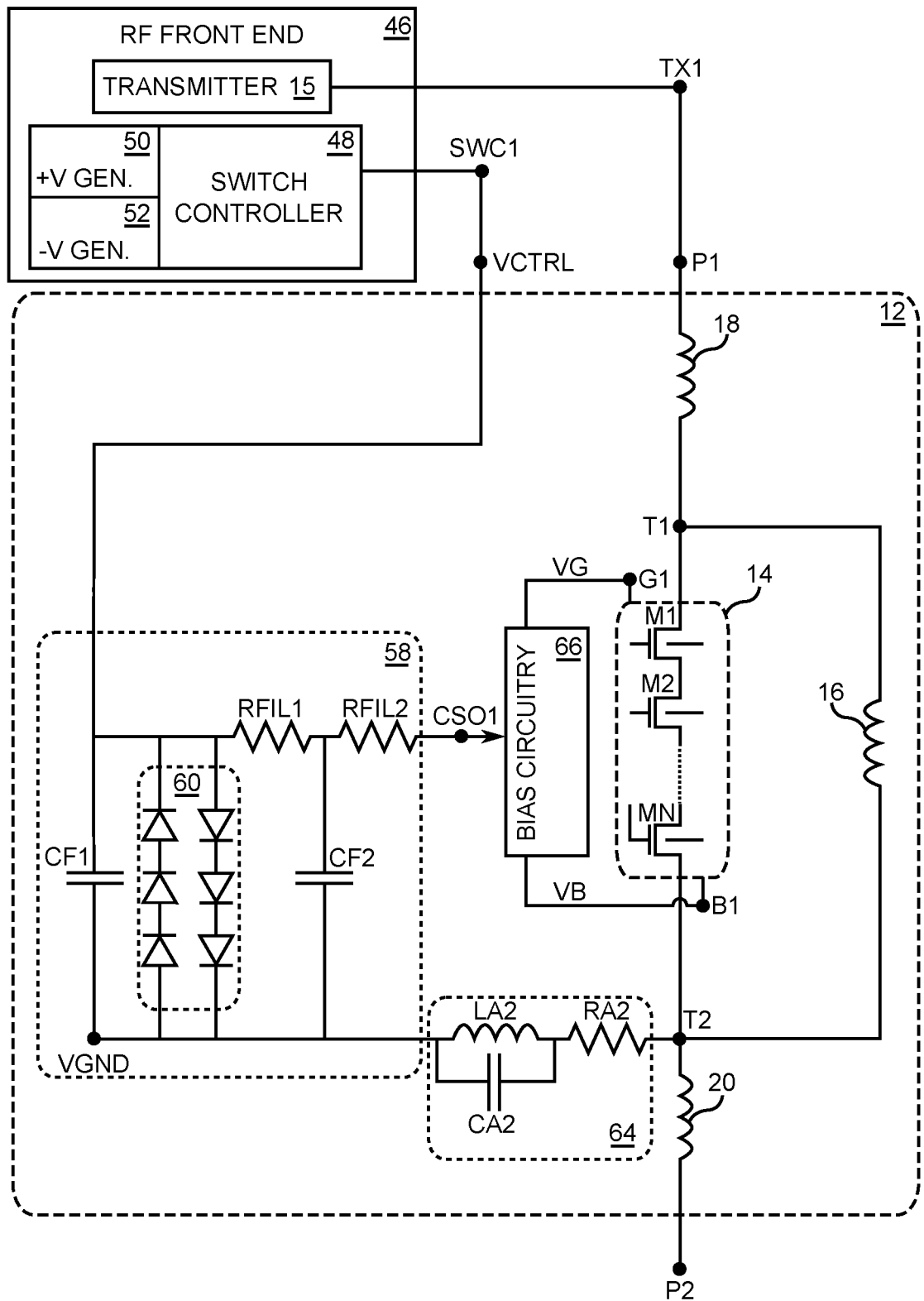
FIG. 14 is an exemplary embodiment of a configuration of the radio frequency switch circuitry having a configuration that can be considered a three-terminal switch die.

FIG. 14 is an exemplary embodiment of a configuration of the radio frequency switch circuitry 12 having a configuration that can be considered a three-terminal switch die. In this exemplary embodiment, the second port P2 and the ground voltage terminal VGND are coupled together to protect the control voltage input terminal VCTRL, the ground voltage terminal VGND, and the first port terminal P1 and the second port terminal P2. In this particular exemplary embodiment, the RF attenuating branch 64 is used to couple the second port P2 together with the ground voltage terminal VGND.

Figure 15:
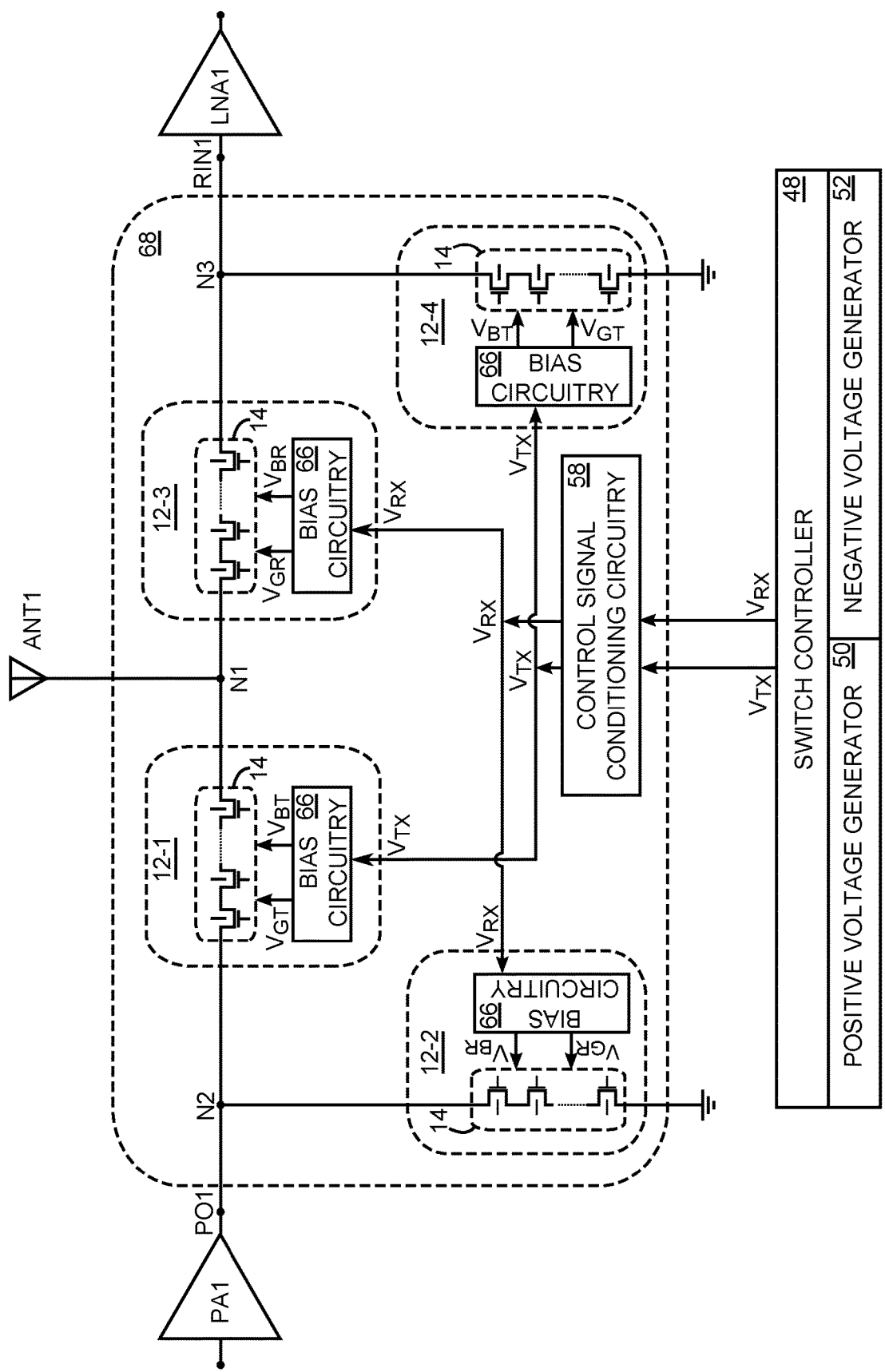
FIG. 15 is a schematic of a single-pole double-throw (SPDT) switch die that integrates a plurality of switch circuitries.

FIG. 15 is a schematic of a single-pole double-throw (SPDT) switch die 68 that integrates a plurality of radio frequency switch circuitries 12. The SPDT switch die 68 is depicted for use in a typical application as a transmit/receive (TX/RX) switch for a power amplifier PA1, an antenna ANT1, and a low-noise amplifier LNA1. A first radio frequency switch circuitry 12-1 of the plurality of radio frequency switch circuitries 12 is in a first series branch coupled between a power output terminal PO1 and a first node N1 at which the antenna ANT1 is coupled. A second radio frequency switch circuitry 12-2 of the plurality of radio frequency switch circuitries 12 is in a first shunt branch coupled between a second node N2 and a fixed voltage terminal such as ground GND. A third radio frequency switch circuitry 12-3 of the plurality of radio frequency switch circuitries 12 is in a second series branch coupled between the first node N1 and an RX input terminal RIN1 of the LNA1. A fourth radio frequency switch circuitry 12-4 of the plurality of radio frequency switch circuitries 12 is in a second shunt branch coupled between a third node N3 and the fixed voltage terminal such as ground GND.

In this exemplary embodiment, the control signal conditioning circuitry 58 is common to each radio frequency switch circuitry 12-1 through 12-4 of the plurality of radio frequency switch circuitries 12. In this particular embodiment, the signal conditioning circuitry is configured to receive a transmit control signal $V_{TX}$ and receive a receive control signal $V_{RX}$ provided by the switch controller 48. The transmit control signal $V_{TX}$ and the receive control signal $V_{RX}$ each have a first voltage level and a second voltage level that places the switch branch 14 of each radio frequency switch circuitry 12-1 through 12-4 of the plurality of radio frequency switch circuitries 12 in the on-state and the off-state without signal decoding of either of the transmit control signal $V_{TX}$ or the receive control signal $V_{RX}$. In this exemplary embodiment, the first voltage level is generated by the positive voltage generator 50, and the second voltage level is generated by the negative voltage generator 52. As with previous embodiments, the control signal conditioning circuitry 58 provides control signal filtering and ESD protection.

In operation, in a transmit mode that routes a transmit signal from the power amplifier PA1 to the antenna ANT1, the switch controller 48 outputs a positive voltage level for the transmit control signal $V_{TX}$ and a negative voltage level for the receive control signal $V_{RX}$. As a result, the switch branch 14 of the first radio frequency switch circuitry 12-1 and the switch branch 14 of the fourth radio frequency switch circuitry 12-4 transition to their on-state, while the switch branch 14 of the second radio frequency switch circuitry 12-2 and the switch branch 14 of the third radio frequency switch circuitry 12-3 transition to their off-state. In a receive mode that routes a receive signal from the antenna ANT1 to the low-noise amplifier LNA1, the switch controller 48 outputs a positive voltage level for the receive control signal $V_{RX}$ and a negative voltage level for the transmit control signal $V_{TX}$. As a result, the switch branch 14 of the first radio frequency switch circuitry 12-1 and the switch branch 14 of the fourth radio frequency switch circuitry 12-4 transition to their off-state, while the switch branch 14 of the second radio frequency switch circuitry 12-2 and the switch branch 14 of the third radio frequency switch circuitry 12-3 transition to their on-state. A typical positive voltage level for the on-state is +2.5 V, and a typical negative voltage level for the off-state is −2.5 V.

The lack of need for signal decoding for the transmit control signal $V_{TX}$ and the receive control signal $V_{RX}$ provides the SPDT switch die 68 with an advantage of requiring at least an order of magnitude less real estate than a similar function switch die that includes circuitry for GPIO decoding, for example. As such, the radio frequency switch circuitry 12 and the switch dies such as the SPDT switch die made up of the radio frequency switch circuitry 12 makes possible applications for radio frequency switch systems wherein circuitry real estate is critical.

Figure 16:
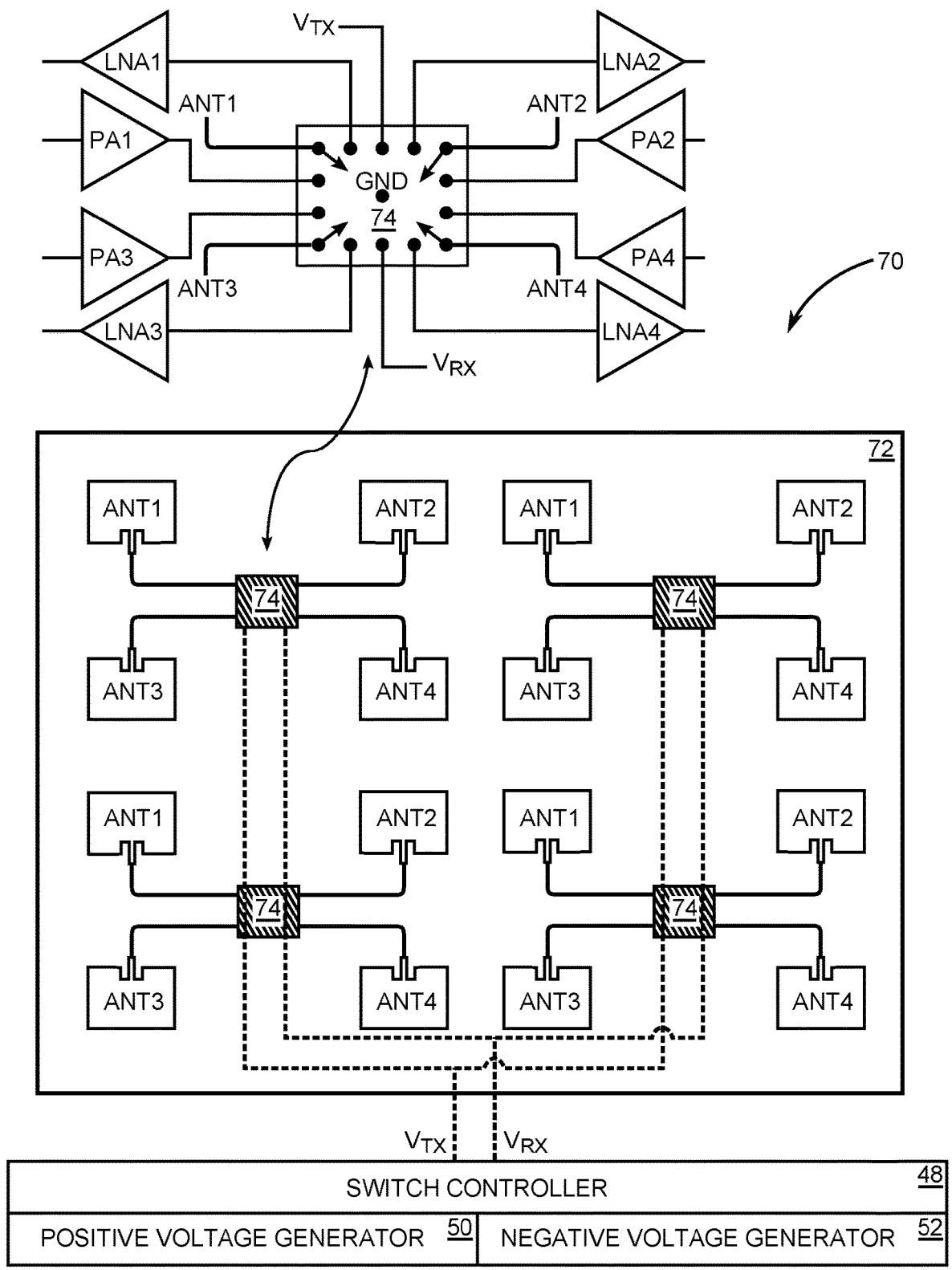
FIG. 16 is a schematic of an exemplary radio frequency switch system that includes a patch phased array having groups of four antennas coupled through a 4×SPDT switch die.

In this regard, FIG. 16 is a schematic of an exemplary radio frequency switch system 70 that includes a patch phased array 72 having groups of four antennas ANT1, ANT2, ANT3, and ANT4. Within each group, each of the antennas ANT1 through ANT4 is selectively coupled between corresponding power amplifiers PA1, PA2, PA3, and PA4 and corresponding low-noise amplifiers LNA1, LNA2, LNA3, and LNA4 by way of a multi-switch die 74. The multi-switch die 74 integrates four SPDT switches that each has the switch topology of the SPDT switch die 68 of FIG. 15.

In operation of the radio frequency switch system 70 in the transmit mode, the switch controller 48 outputs a positive voltage level generated by the positive voltage generator 50 for the transmit control signal $V_{TX}$ and a negative voltage level generated by the negative voltage generator 52 for the receive control signal $V_{RX}$. As a result, the multi-switch die 74 responds by coupling outputs of the power amplifiers PA1-PA4 to corresponding ones of the antennas ANT1-ANT4 of each group while decoupling inputs to the low-noise amplifiers LNA1-LNA4 from the corresponding ones of the antennas ANT1-ANT4 of each group. In contrast, in the receive mode, the switch controller 48 outputs a negative voltage level generated by the negative voltage generator 52 for the transmit control signal $V_{TX}$ and a positive voltage level generated by the positive voltage generator 50 for the receive control level $V_{RX}$. As a result, the multi-switch die 74 responds by decoupling outputs of the power amplifiers PA1-PA4 from corresponding ones of the antennas ANT1-ANT4 of each group while coupling inputs to the low-noise amplifiers LNA1-LNA4 to corresponding ones of the antennas ANT1-ANT4 of each group.

The switch controller 48 is typically in communication with a base-band processor (not shown) that sends commands to the switch controller 48 to select either the transmit mode or the receive mode for the radio frequency switch system 70 depending upon desired operation with a given communication band and communication protocol. For example, sequences of operation for the radio frequency switch system 70 may depend upon the generation of wireless technology such as 2G, 3G, 4G, and 5G, and a particular band of operation such as Ku and K-bands.

It is also to be understood that while the exemplary radio frequency switch system 70 is depicted configured for synchronous operation in which all antennas ANT1-ANT4 of each group are either in transmit mode or receive mode, the radio frequency switch system 70 may also be configured for asynchronous operation. For example, in asynchronous operation, select ones of the antennas ANT1-ANT4 may be in the transmit mode for a first band and others of the antennas ANT1-ANT4 may be simultaneously in the receive mode for a second band. The first band may be a high band and the second band may be a low band, and vice versa. Moreover, an advantage of the radio frequency switch system 70 pertaining to the patch antenna example of FIG. 16 is that half-wavelength and quarter-wavelength spacing of the antennas ANT1-ANT4 is achievable because there is no need for signal decoding circuitry to be integrated into the multi-switch die 74. Further still, the switch controller 48, the positive voltage generator 50, and the negative voltage generator 52 are external to the patch phased array 72.

Figure 17:
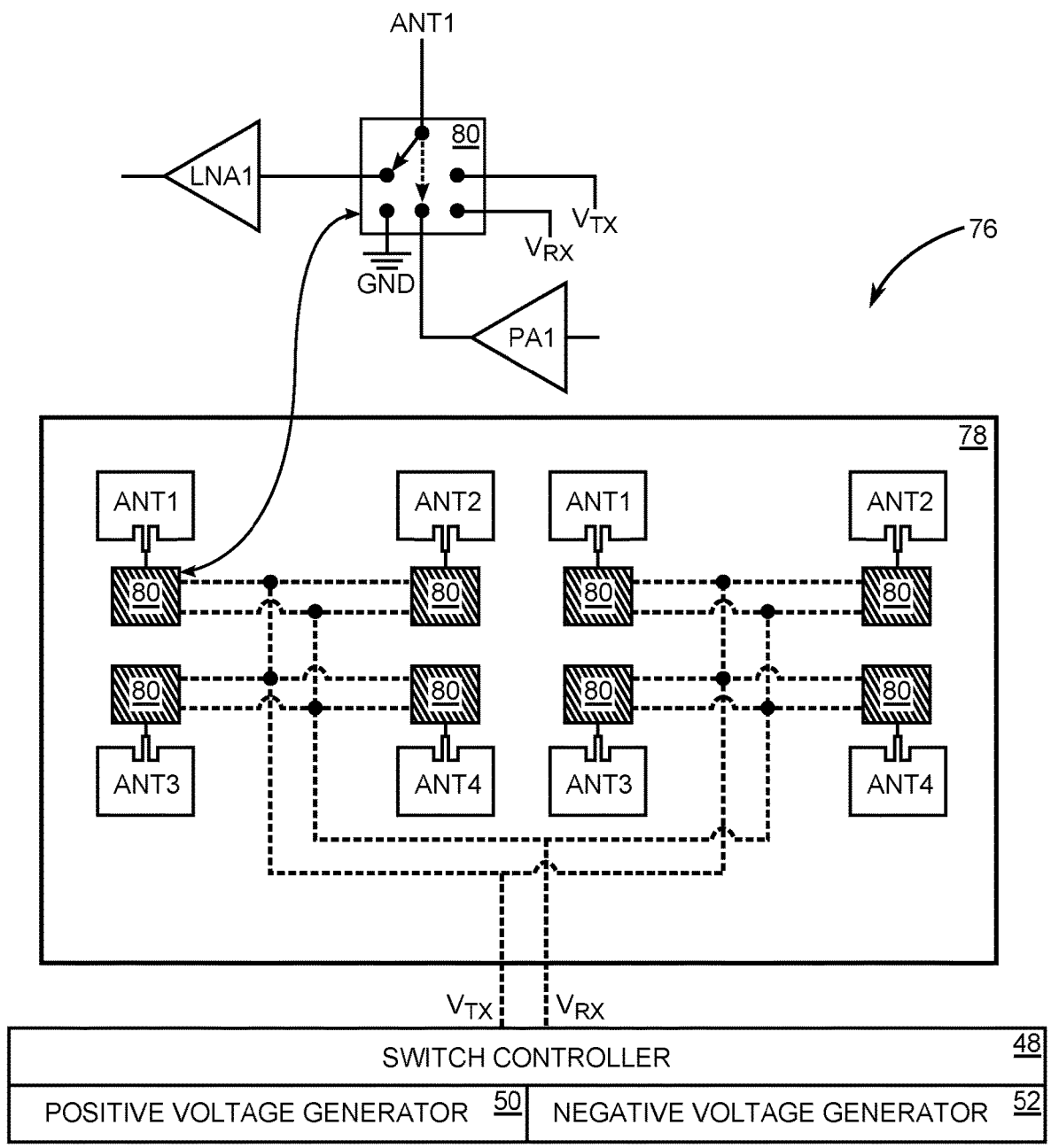
FIG. 17 is a schematic of another exemplary radio frequency switch system that includes a patch phased array having individual antennas coupled to a power amplifier through a SPDT switch die.

FIG. 17 is a schematic of another exemplary radio frequency switch system 76 that includes a patch phased array 78 having two groups of four antennas ANT1, ANT2, ANT3, and ANT4. Within each group, each of the antennas ANT1 through ANT4 is selectively coupled between corresponding power amplifiers such as PA1 and corresponding low-noise amplifiers such as LNA1 by way of a single-switch die 80. The single-switch die 80 integrates one SPDT switch having the switch topology of the SPDT switch die 68 of FIG. 15. In this particular exemplary radio frequency switch system 76, one of the single-switch die 80 is dedicated to each of the antennas ANT1-ANT4 of each group.

In operation of the radio frequency switch system 76 in the transmit mode, the switch controller 48 outputs a positive voltage level generated by the positive voltage generator 50 for the transmit control signal $V_{TX}$ and a negative voltage level generated by the negative voltage generator 52 for the receive control signal $V_{RX}$. As a result, as depicted in the outset of FIG. 17, the single-switch die 80 responds by coupling the output of corresponding ones of the power amplifiers, such as PA1, to corresponding ones of the antennas, such as ANT1, while decoupling the input to the low-noise amplifiers, such as LNA1, from the corresponding one of the antennas, such as ANT1. In contrast, in the receive mode, the switch controller 48 outputs a negative voltage level generated by the negative voltage generator 52 for the transmit control signal $V_{TX}$ and a positive voltage level generated by the positive voltage generator 50 for the receive control level $V_{RX}$. As a result, the single-switch die 80 responds by decoupling the output of the power amplifiers, such as PA1, from a corresponding ones of the antennas, such as ANT1, while the coupling inputs to the low-noise amplifiers, such as LNA1, to corresponding ones of the antennas, such as ANT1.

Figure 18:
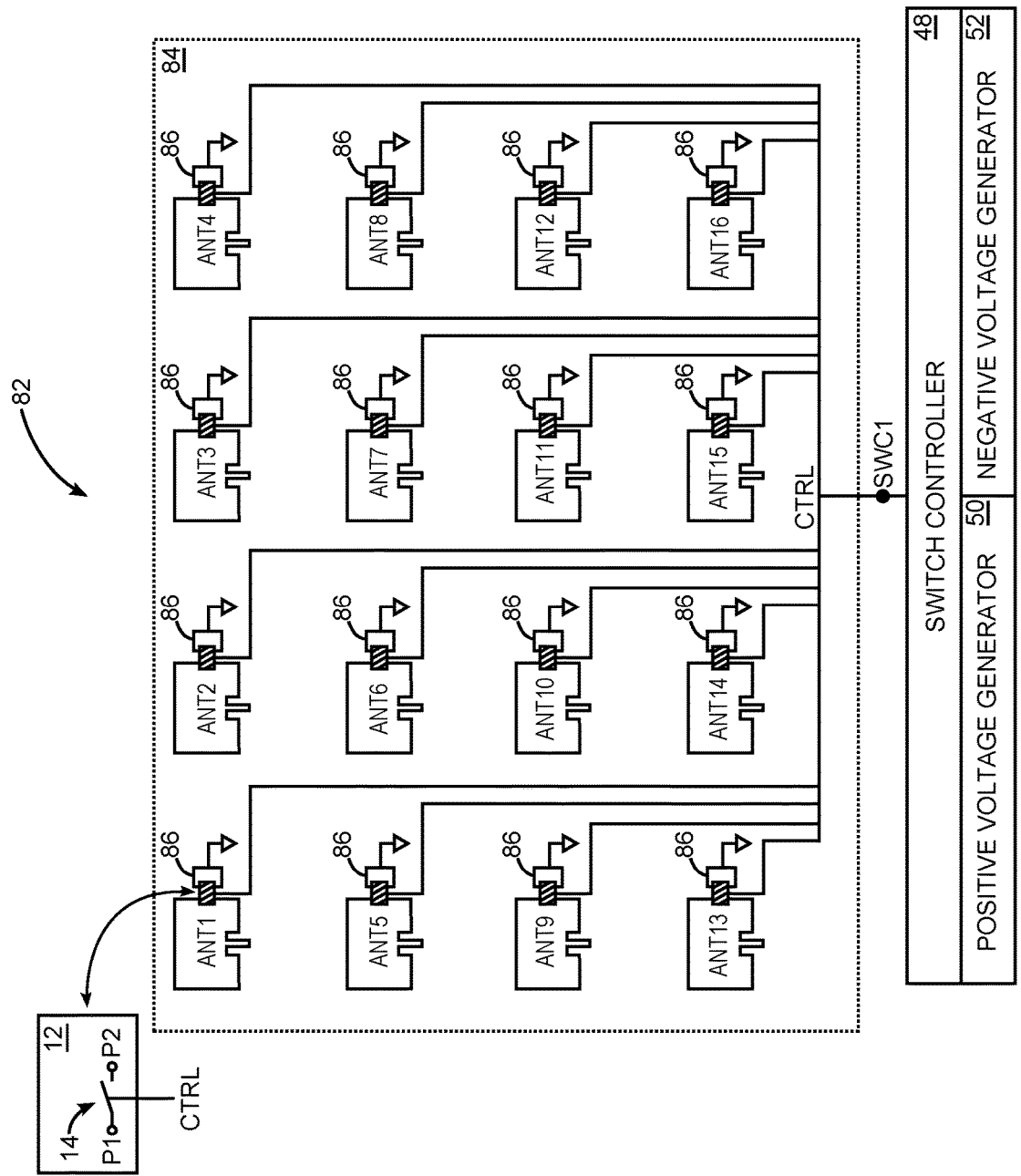
FIG. 18 is a schematic of yet another exemplary radio frequency switch system that illustrates general reconfigurability of radio frequency systems having a plurality of switches by way of a the single control output in accordance with the present disclosure.

FIG. 18 is a schematic of yet another exemplary radio frequency switch system 82 that illustrates general reconfigurability of radio frequency systems having a plurality of switches by way of a the single control output. The exemplary radio frequency switch system 82 includes a patch phased array 84 having sixteen antennas ANT1 through A16 that are each selectably coupled to one of a plurality of a load impedances 86 by one of a plurality of the radio frequency switch circuitries 12. The load impedance 86 may be inductive, capacitive, resistive, and combinations thereof.

In operation, the positive voltage generator 50 and the negative generator 52 generate voltage levels needed to transition each one of the plurality of the switch branches 14 between the off-state and the on-state, and vice versa. The switch controller 48 outputs a positive voltage level generated by the positive voltage generator 50 through the switch control terminal SWC1 to synchronously turn each of the plurality of switch branches 14 to the on-state, which in turn couples each of the antennas ANT1 through ANT16 to a corresponding one of the plurality of the load impedances 86. To decouple the corresponding one of the plurality of the load impedances 86, the switch controller 48 outputs a negative voltage generated by the negative voltage generator 52 through the switch control terminal SWC1 to synchronously turn each of the plurality of switch branches 14 to the off-state.

This particular example provides impedance tuning of the patched phased array 84 using a single control signal output CTRL through the switch control output terminal SWC1 of the switch controller 48. However, it is to be understood, the exemplary radio frequency switch system 82 is but one example of using a single switch control output to control a plurality of the radio frequency switch circuitries 12 to achieve reconfigurability of radio frequency systems. At least one advantage of embodiments such as illustrated in FIG. 18 is efficient use of real estate by employing only one of the switch controllers 48, one of the positive voltage generators 50, and one of the negative voltage generators 52 in order to control pluralities of the radio frequency switch circuitries 12. At least one other advantage is the lack of need for signal decoding for the single control signal output CTRL with an advantage of requiring at least an order of magnitude less real estate than a similar function radio frequency switch circuitry that includes circuitry for GPIO decoding, for example. Such huge savings of real estate allows higher frequency patch phased arrays to be realized by allowing the antennas of the patched phased array to be appropriately spaced from one another.

Those skilled in the art will recognize improvements and modifications to the preferred embodiments of the present disclosure. All such improvements and modifications are considered within the scope of the concepts disclosed herein and the claims that follow.

What is claimed is:
1. A radio frequency switch system comprising:
a plurality of radio frequency switch circuitries that each include a switch branch coupled between a first branch terminal and a second branch terminal and an isolation inductor coupled between the first branch terminal and the second branch terminal in parallel with the switch branch, wherein the isolation inductor has a given inductance that provides resonance with a total off-state capacitance of the switch branch at a center frequency of a radio frequency signal that is within a frequency range that extends from 26 GHz to 66 GHz to allow passage of the radio frequency signal through the switch branch in an on-state and block the radio frequency signal from passing through the switch branch in an off-state in response to a control signal applied to a branch control terminal of the switch branch;
a switch controller configured to apply the control signal to the branch control terminal of the switch branch of each of the plurality of radio frequency switch circuitries, wherein the control signal has a first voltage level that places the switch branch in the on-state and a second voltage level that places the switch branch in the off-state without digital signal decoding of the control signal; and a plurality of patch antennas and a plurality of load impedances, wherein each of the plurality of radio frequency switch circuitries is coupled to a corresponding one of the plurality of patch antennas such that a corresponding one of the plurality of load impedances selectively loads the corresponding one of the plurality of patch antennas when the switch branch of a corresponding one of the plurality of radio frequency switch circuitries is in the on-state.

2. The radio frequency switch system of claim 1 wherein each one of the plurality of radio frequency switch circuitries is integrated onto a separate die.

3. The radio frequency switch system of claim 1 wherein the plurality of radio frequency switch circuitries is integrated into a single die.

4. The radio frequency switch system of claim 1 wherein the switch controller has a single control signal output terminal that is coupled to the branch control terminal of each of the plurality of radio frequency switch circuitries through which the control signal is passed to transition the switch branch of each of the plurality of radio frequency switch circuitries between the on-state and the off-state.

5. The radio frequency switch system of claim 1 wherein the switch controller has a plurality of control signal output terminals each of which is coupled to the branch control terminal of the switch branch of the corresponding ones of the plurality of radio frequency switch circuitries, wherein the switch controller is configured to pass the control signal to the switch branch of the corresponding ones of the plurality of radio frequency switch circuitries to transition the switch branch of the corresponding ones of the plurality of radio frequency switch circuitries between the on-state and the off-state.

6. The radio frequency switch system of claim 1 wherein the switch branch of each of the plurality of radio frequency switch circuitries comprises a stack of an N number of transistors coupled in series between the first branch terminal and the second branch terminal where N is a finite whole counting number.

7. The radio frequency switch system of claim 6 further including a first resistor network configured to bias gates of the stack of the N number of transistors.

8. The radio frequency switch system of claim 7 further including a second resistor network configured to bias bodies of the stack of the N number of transistors.

9. The radio frequency switch system of claim 1 wherein the switch branch of each of the plurality of radio frequency switch circuitries comprises a microelectromechanical systems switch device.

10. The radio frequency switch system of claim 1 wherein each of the plurality of radio frequency switch circuitries further comprises:
a first port terminal and a second port terminal wherein the switch branch is further configured to pass the radio frequency signal between the first branch terminal and the second branch terminal in the on-state and block the radio frequency signal from passing between the first branch terminal and the second branch terminal in the off-state in response to the control signal that is coupled with the radio frequency signal and received at the first port terminal; and
control signal decoupling circuitry having a control signal input terminal coupled to the first port terminal to receive the control signal coupled to the radio frequency signal and a control signal output terminal coupled to the branch control terminal, wherein the control signal decoupling circuitry is configured to decouple the control signal from the radio frequency signal and provide the control signal to the branch control terminal.

11. The radio frequency switch system of claim 10 further comprising a direct current blocking capacitor coupled between the control signal input terminal and the first branch terminal to block the control signal from entering the switch branch from the first branch terminal.

12. The radio frequency switch system of claim 10 wherein the control signal decoupling circuitry of each of the plurality of radio frequency switch circuitries comprises control signal conditioning circuitry configured to filter the radio frequency signal from the control signal.

13. The radio frequency switch system of claim 12 further including a first radio frequency attenuating branch coupled between a control voltage input terminal and the control signal input terminal to present impedance to the radio frequency signal within a first path that includes the control signal conditioning circuitry.

14. The radio frequency switch system of claim 13 further including a ground voltage terminal and a second radio frequency attenuating branch coupled between the ground voltage terminal and the second port terminal to present impedance to the radio frequency signal within a second path that includes the control signal conditioning circuitry.

15. The radio frequency switch system of claim 14 wherein the first radio frequency attenuating branch comprises a first resistor coupled between the control voltage input terminal and the first port terminal and the second radio frequency attenuating branch comprises a second resistor coupled between the ground voltage terminal and the second port terminal.

16. The radio frequency switch system of claim 14 wherein the first radio frequency attenuating branch comprises a first inductor coupled between the control voltage input terminal and the first port terminal and the second radio frequency attenuating branch comprises a second inductor coupled between the ground voltage terminal and the second port terminal.

17. The radio frequency switch system of claim 16 further including a first capacitor coupled in parallel with the first inductor and a second capacitor coupled in parallel with the second inductor.

18. The radio frequency switch system of claim 14 wherein the control signal conditioning circuitry comprises a low-pass filter configured to filter the radio frequency signal from the control signal.

19. The radio frequency switch system of claim 14 wherein the control signal conditioning circuitry comprises electrostatic discharge (ESD) shunting diodes coupled between the control voltage input terminal and the ground voltage terminal wherein the ESD shunting diodes are configured to shunt energy of an ESD event away from the switch branch.

20. The radio frequency switch system of claim 10 further comprising an isolation inductor coupled between the first branch terminal and the second branch terminal such that the isolation inductor is in parallel with the switch branch, wherein the isolation inductor has a given inductance that provides resonance with a total off-state capacitance of the switch branch at a center frequency of the radio frequency signal that is within a frequency range that extends from 26 GHz to 66 GHz.

21. The radio frequency switch system of claim 1 wherein the plurality of radio frequency switch circuitries is integrated into a single-pole double-throw switch die.

22. The radio frequency switch system of claim 1 wherein the plurality of radio frequency switch circuitries is integrated into a switch die including two series switch branches and two shunt switch branches.

23. The radio frequency switch system of claim 1 wherein the switch controller is configured to control switching of the plurality of radio frequency switch circuitries synchronously by transmitting the control signal through a single output control terminal.

* * * * *